US008589124B2

(12) United States Patent
Huang

(10) Patent No.: US 8,589,124 B2
(45) Date of Patent: *Nov. 19, 2013

(54) METHODS FOR MODELING WEAR OF FIXED CUTTER BITS AND FOR DESIGNING AND OPTIMIZING FIXED CUTTER BITS

(75) Inventor: Sujian Huang, The Woodlands, TX (US)

(73) Assignee: Smith International, Inc., Houston, TX (US)

( * ) Notice: Subject to any disclaimer, the term of this patent is extended or adjusted under 35 U.S.C. 154(b) by 2262 days.

This patent is subject to a terminal disclaimer.

(21) Appl. No.: 10/888,354

(22) Filed: Jul. 9, 2004

(65) Prior Publication Data

US 2005/0015229 A1      Jan. 20, 2005

(51) Int. Cl.
G06F 7/60 (2006.01)
G06F 17/10 (2006.01)
G06G 7/48 (2006.01)
E21B 44/00 (2006.01)
E21B 7/00 (2006.01)
E21B 10/36 (2006.01)

(52) U.S. Cl.
USPC .......... 703/2; 703/7; 703/10; 175/24; 175/57; 175/431

(58) Field of Classification Search
USPC .......... 703/2, 7, 10; 175/24, 57, 431; 702/151
See application file for complete search history.

(56) References Cited

U.S. PATENT DOCUMENTS

| 4,475,606 A | 10/1984 | Crow |
| 4,815,342 A * | 3/1989 | Brett et al. .................. 76/108.2 |
| 4,862,974 A | 9/1989 | Warren |
| 4,932,484 A | 6/1990 | Warren |
| 4,982,802 A | 1/1991 | Brett et al. |
| 5,010,789 A | 4/1991 | Brett |
| 5,042,596 A | 8/1991 | Brett |
| 5,131,478 A * | 7/1992 | Brett et al. ...................... 175/57 |
| 5,131,479 A | 7/1992 | Boulet et al. |
| 5,178,222 A | 1/1993 | Jones |
| 5,216,917 A | 6/1993 | Detournay |
| RE34,435 E | 11/1993 | Warren et al. |

(Continued)

FOREIGN PATENT DOCUMENTS

| BE | 1013217 A6 | 10/2001 |
| CA | 2369885 | 7/2002 |

(Continued)

OTHER PUBLICATIONS

Drag-Bit Performance Modeling, Warren et al, SPE Drilling Engineering, Jun. 1989.*

(Continued)

*Primary Examiner* — Akash Saxena
(74) *Attorney, Agent, or Firm* — Osha Liang LLP

(57) ABSTRACT

In one aspect, the invention provides a method for modeling the wear of a fixed cutter bit drilling earth formations. A method for determining wear of a fixed cutter drill bit includes simulating the fixed cutter drill bit drilling an earth formation; determining a cutter-formation interaction force and a relative sliding velocity of a selected area on a cutting surface on a cutter of the fixed cutter drill bit during the drilling; and calculating a wear rate of the selected area based on the cutter-formation interaction force and the relative sliding velocity.

4 Claims, 28 Drawing Sheets

(56) References Cited

U.S. PATENT DOCUMENTS

| | | | |
|---|---|---|---|
| 5,318,136 A * | 6/1994 | Rowsell et al. | 175/24 |
| 5,456,141 A | 10/1995 | Ho | |
| 5,605,198 A | 2/1997 | Tibbitts | |
| 5,613,093 A | 3/1997 | Kolb | |
| 5,787,022 A | 7/1998 | Tibbitts | |
| 5,803,196 A | 9/1998 | Fielder | |
| 5,903,743 A | 5/1999 | Kolb | |
| 5,950,747 A | 9/1999 | Tibbitts | |
| 5,999,891 A * | 12/1999 | Rey-Fabret et al. | 702/151 |
| 6,021,859 A * | 2/2000 | Tibbitts et al. | 175/431 |
| 6,095,262 A | 8/2000 | Chen | |
| 6,151,960 A * | 11/2000 | Taylor et al. | 73/152.52 |
| 6,213,225 B1 | 4/2001 | Chen | |
| 6,269,893 B1 | 8/2001 | Beaton | |
| 6,298,930 B1 | 10/2001 | Sinor | |
| 6,412,577 B1 | 7/2002 | Chen | |
| 6,435,058 B1 * | 8/2002 | Matthias et al. | 76/108.2 |
| 6,516,293 B1 | 2/2003 | Huang | |
| 6,536,543 B2 | 3/2003 | Meiners | |
| 6,619,411 B2 * | 9/2003 | Singh et al. | 175/57 |
| 6,695,073 B2 | 2/2004 | Glass | |
| 6,711,969 B2 | 3/2004 | Meiners | |
| 6,729,420 B2 | 5/2004 | Mensa-Wilmot | |
| 6,785,641 B1 * | 8/2004 | Huang | 703/7 |
| 6,856,949 B2 * | 2/2005 | Singh et al. | 703/7 |
| 7,020,597 B2 * | 3/2006 | Oliver et al. | 703/7 |
| 7,139,689 B2 * | 11/2006 | Huang | 703/7 |
| 2002/0100620 A1 | 8/2002 | Singh et al. | |
| 2004/0059554 A1 * | 3/2004 | Goldman et al. | 703/7 |
| 2007/0093996 A1 * | 4/2007 | Cariveau et al. | 703/7 |
| 2007/0106487 A1 * | 5/2007 | Gavia et al. | 703/7 |

FOREIGN PATENT DOCUMENTS

| | | |
|---|---|---|
| EP | 0728912 A2 | 8/1996 |
| EP | 0972908 A2 | 1/2000 |
| EP | 1146200 A1 | 10/2001 |
| GB | 2241266 A | 8/1991 |
| GB | 2300208 A | 10/1996 |
| GB | 2339815 A | 2/2000 |
| GB | 2346628 A | 8/2000 |
| GB | 2367843 A | 4/2002 |
| GB | 2379699 A | 3/2003 |
| WO | WO-01/33027 A2 | 5/2001 |
| WO | WO-02/077407 A1 | 10/2002 |

OTHER PUBLICATIONS

Senor et al "Drag Bit Wear Model" SPE 1989 p. 128-136.*
Glowka, et al., "Progress in the Advanced Synthetic-Diamond Drill Bit Program"; ASME International (pp. 87-95).
Glowka, David A., "Use of Single-Cutter Data in the Analysis of PDC Bit Designs: Part 1—Development of a PDC Cutting Force Model"; JPT, Aug. 1989 (pp. 797-799, 844-849).
Glowka, D.A., "Use of Single-Cutter Data in the Analysis of PDC Bit Designs: Part 2—Development and Use of the PDCWEAR Computer Code", JPT, Aug. 1989 (pp. 850-859).
International Search Report dated Nov. 22, 2004; Appl. No. PCT/US2004/021957, (6 pages).
International Search Report dated Nov. 22, 2004; Appl. No. PCT/US2004/022231, (6 pages).
Glowka, David A.; Development of a Method for Predicting the Performance and Wear of PDC Drill Bits prepared by Sandia National Laboratories, Albuquerque, NM 87185, Sep. 1987.
Glowka et al.; Program Plan for the Development of Advanced Synthetic-Diamond Drill Bits for Hard-Rock Drilling; Sandia National Laboratories, Albuquerque, NM; Sep. 1993.
Finger, J. T. et al.; PDC Polycrystalline Diamond Compact) Bit Research at Sandia National Laboratories; U.S. Department of Commerce; National Technical Information Service, Jun. 1989.
Baird, Jerold A. et al.; "Analyzing the Dynamic Behavior of Downhole Equipment During Drilling"; pp. 1-5.
Clayton, Robert et al.; SPE/IADC 91840; "New Bit Design, Cutter Technology Extend PDC Applications to Hard Rock Drilling"; pp. 1-9.
SPE Society of Petroleum Engineers of AME; $59^{th}$ Annual Technical Conference and Exhibition, Houston, Texas, Sep. 16-19, 1984 (24 pages).
T.M. Warren et al.; "Drag-Bit Performance Modeling"; SPE Drilling Engineering, Jun. 1989; pp. 119-127 (9 pages).
T.M. Warren et al.; "Laboratory Drilling Performance of PDC Bits"; SPE Drilling Engineering, Jun. 1988; pp. 125-135 (11 pages).
SPE/IADC 67697, "Improving Drilling Performance by Applying Advanced Dynamics Models"; M.W. Dykstra, et al.; Prepared for presentation at Drilling Conference held in Amsterdam, The Netherlands, Feb. 27-Mar. 1, 2001; 18 pages.
Examiner's Report dated Sep. 4, 2007 for Canadian Application No. 2,531,397, (3 pages).

* cited by examiner

Wear model could comprise data
obtained from cutter/formation interaction
test. Test run for period of time and
wear of cutting element recorded for
test at selected times during test.

FIG. 6B

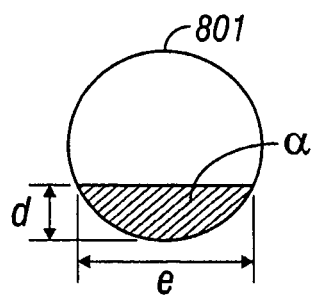
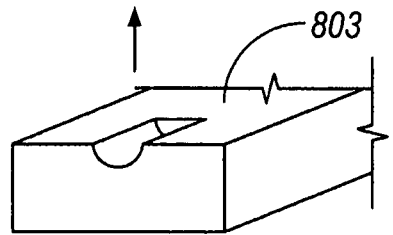
FIG. 8A  FIG. 8B
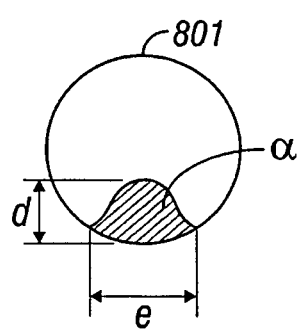
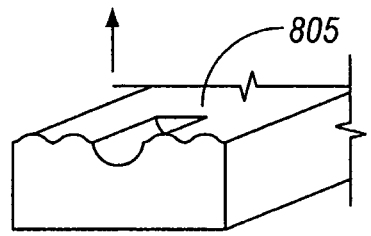
FIG. 9A  FIG. 9B
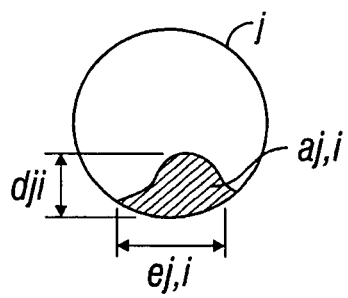
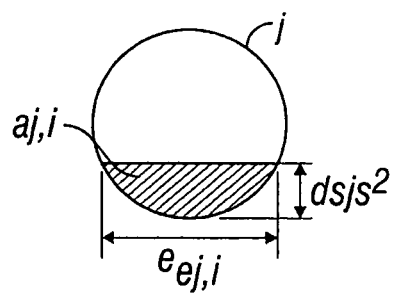
FIG. 9C-1  FIG. 9C-2

⋮

| | |
|---|---|
| $F_R$ | $f_r$ |
| $F_N$ | $f_n$ |
| $F_T$ | $f_t$ |
| Formation type | FT |
| Cutter height location | h |
| Cutter radial location W/respect to bit axis | b |
| Cutter profile angle | $\theta_{cpa}$ |
| Cutter back size | $\delta_{bs}$ |
| Cutter shape | CSP |
| Cutter size | $\phi_{cs}$ |
| Cutter type | $\sigma$ |
| Interference surface area | a |
| Contacting edge length | e |
| Depth of cut | d |
| Side rake angle | $\alpha_{sr}$ |
| Back rake angle | $\alpha_{br}$ |

METHODS FOR MODELING WEAR OF FIXED CUTTER BITS AND FOR DESIGNING AND OPTIMIZING FIXED CUTTER BITS

CROSS-REFERENCE TO RELATED APPLICATIONS

This application claims priority, pursuant to 35 U.S.C. §119(e), to U.S. Provisional Patent Application Ser. No. 60/485,642, filed Jul. 9, 2003. This application claims the benefit, pursuant to 35 U.S.C. §120, as a continuation-in-part of U.S. patent application Ser. No. 09/635,116, filed Aug. 9, 2000. All of these applications are expressly incorporated by reference in their entirety.

Further, U.S. patent application entitled "Methods For Modeling, Displaying, Designing, And Optimizing Fixed Cutter Bits," filed on Jul. 9, 2004, U.S. patent application entitled "Methods for Designing Fixed Cutter Bits and Bits Made Using Such Methods," filed on Jul. 9, 2004, and U.S. patent application entitled "Methods For Modeling, Designing, And Optimizing The Performance Of Drilling Tool Assemblies," filed on Jul. 9, 2004 are incorporated by reference in their entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

STATEMENT REGARDING FEDERALLY SPONSORED RESEARCH

Not applicable.

BACKGROUND OF THE INVENTION

1. Field of the Invention

The invention relates generally to fixed cutter drill bits used to drill boreholes in subterranean formations. More specifically, the invention relates to methods for modeling the drilling performance of a fixed cutter bit drilling through an earth formation, methods for designing fixed cutter drill bits, and methods for optimizing the drilling performance of a fixed cutter drill bit.

2. Background Art

Fixed cutter bits, such as PDC drill bits, are commonly used in the oil and gas industry to drill well bores. One example of a conventional drilling system for drilling boreholes in subsurface earth formations is shown in FIG. 1. This drilling system includes a drilling rig 10 used to turn a drill string 12 which extends downward into a well bore 14. Connected to the end of the drill string 12 is a fixed cutter drill bit 20.

As shown in FIG. 2, a fixed cutter drill bit 20 typically includes a bit body 22 having an externally threaded connection at one end 24, and a plurality of blades 26 extending from the other end of bit body 22 and forming the cutting surface of the bit 20. A plurality of cutters 28 are attached to each of the blades 26 and extend from the blades to cut through earth formations when the bit 20 is rotated during drilling. The cutters 28 deform the earth formation by scraping and shearing. The cutters 28 may be tungsten carbide inserts, polycrystalline diamond compacts, milled steel teeth, or any other cutting elements of materials hard and strong enough to deform or cut through the formation. Hardfacing (not shown) may also be applied to the cutters 28 and other portions of the bit 20 to reduce wear on the bit 20 and to increase the life of the bit 20 as the bit 20 cuts through earth formations.

Significant expense is involved in the design and manufacture of drill bits and in the drilling of well bores. Having accurate models for predicting and analyzing drilling characteristics of bits can greatly reduce the cost associated with manufacturing drill bits and designing drilling operations because these models can be used to more accurately predict the performance of bits prior to their manufacture and/or use for a particular drilling application. For these reasons, models have been developed and employed for the analysis and design of fixed cutter drill bits.

Two of the most widely used methods for modeling the performance of fixed cutter bits or designing fixed cutter drill bits are disclosed in Sandia Report No. SAN86-1745 by David A. Glowka, printed September 1987 and titled "Development of a Method for Predicting the Performance and Wear of PDC drill Bits" and U.S. Pat. No. 4,815,342 to Bret, et al. and titled "Method for Modeling and Building Drill Bits," which are both incorporated herein by reference. While these models have been useful in that they provide a means for analyzing the forces acting on the bit, using them may not result in a most accurate reflection of drilling because these models rely on generalized theoretical approximations (typically some equations) of cutter and formation interaction that may not be a good representation of the actual interaction between a particular cutting element and the particular formation to be drilled. Assuming that the same general relationship can be applied to all cutters and all earth formations, even though the constants in the relationship are adjusted, may result in an inaccurate prediction of the response of an actual bit drilling in earth formation.

A method is desired for modeling the overall cutting action and drilling performance of a fixed cutter bit that more accurately reflects the interactions between a cutter and an earth formation during drilling.

SUMMARY OF THE INVENTION

The invention relates to a method for modeling wear of a fixed cutter bit drilling an earth formation. A method for determining wear of a fixed cutter drill bit in accordance with one embodiment of the invention includes simulating the fixed cutter drill bit drilling an earth formation; determining a cutter-formation interaction force and a relative sliding velocity of a selected area on a cutting surface on a cutter of the fixed cutter drill bit during the drilling; and calculating a wear rate of the selected area based on the cutter-formation interaction force and the relative sliding velocity.

One aspect of the present invention relates to a method for designing a fixed cutter bit having a plurality of cutters. A method for designing a fixed cutter drill bit in accordance with one embodiment of the invention includes selecting initial bit design parameters; simulating drilling an earth formation using the fixed cutter drill bit; determining wears on the plurality of cutters, wherein the determining the wears comprises determining a cutter-formation interaction force and a relative sliding velocity for each contact area on each of the plurality of cutters during the drilling, and calculating a wear rate of the each contact area based on the cutter-formation interaction force and the relative sliding velocity; displaying a graphical display of the wears on the plurality of cutters; adjusting at least one bit design parameter based on the graphical display; and repeating the simulating, the determining, and the adjusting until at least one drilling performance parameter is optimized Other aspects and advantages of the invention will be apparent from the following description, figures, and the appended claims.

BRIEF DESCRIPTION OF THE DRAWINGS

FIGS. 6A-6G show examples of visual representations generated for one embodiment of the invention.

FIGS. 8A and 9A show examples of a cutter of a fixed cutter bit and the cutting area of interference between the cutter and the earth formation.

FIGS. 8B and 9B show examples of the cuts formed in the earth formation by the cutters illustrated in FIGS. 8A and 9A, respectively.

FIGS. 9C-1 and 9C-2 show examples of partial cutter contact with formation and cutter/formation interaction parameters calculated during drilling being converted to equivalent interaction parameters to correspond to cutter/formation interaction data.

FIGS. 10A and 10B show an example of a cutter/formation test data record and a data table of cutter/formation interaction.

DETAILED DESCRIPTION OF PREFERRED EMBODIMENTS

Figure 1:
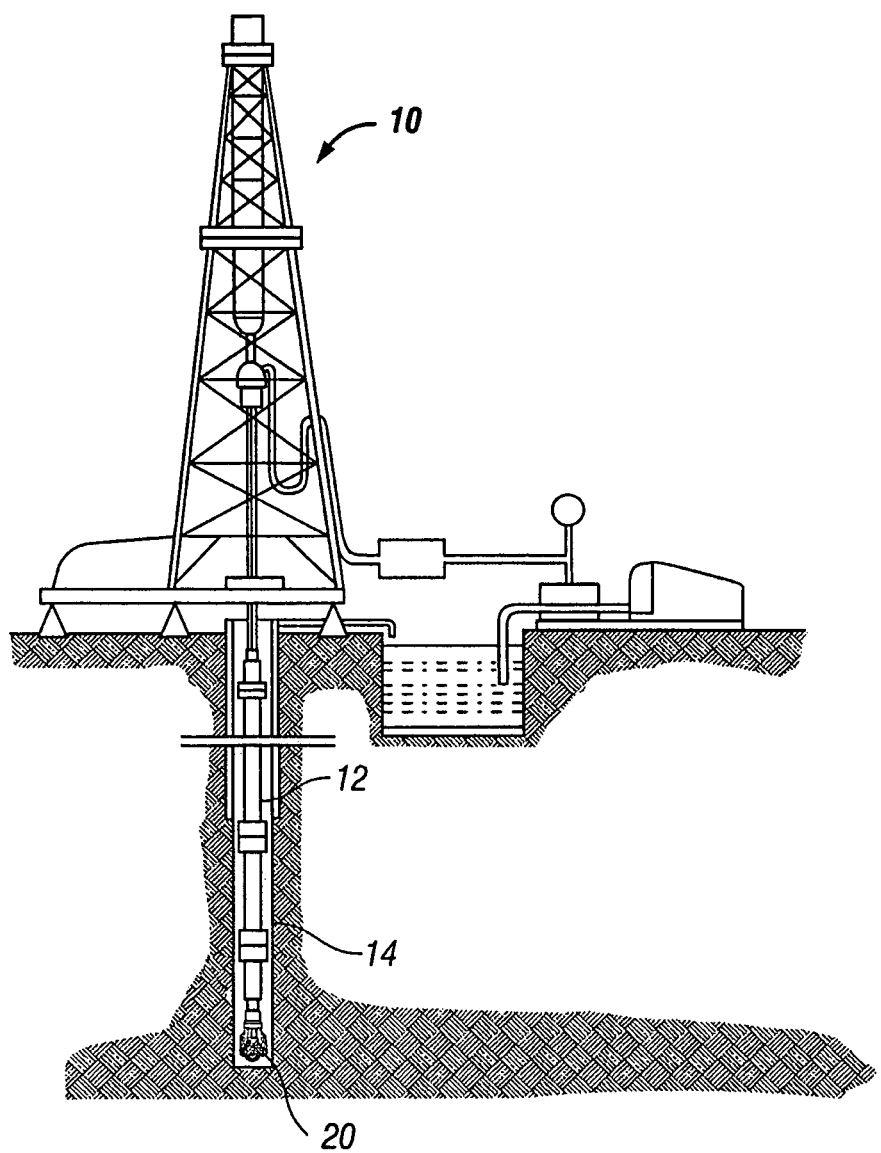
FIG. 1 shows a schematic diagram of a conventional drilling system which includes a drill string having a fixed cutter drill bit attached at one end for drilling bore holes through subterranean earth formations.

The present invention provides methods for modeling the wear and performance of fixed cutter bits drilling earth formations. In one aspect, a method takes into account actual interactions between cutters and earth formations during drilling. Methods in accordance with one or more embodiments of the invention may be used to predict how a cutter on a drill wears, to design fixed cutter drill bits, to optimize the performance of bits, to optimize the response of an entire drill string during drilling, or to generate visual displays of drilling.

In accordance with one aspect of the present invention, one or more embodiments of a method for modeling the dynamic performance of a fixed cutter bit drilling earth formations includes selecting a drill bit design and an earth formation to be represented as drilled, wherein a geometric model of the bit and a geometric model of the earth formation to be represented as drilled are generated. The method also includes incrementally rotating the bit on the formation and calculating the interaction between the cutters on the bit and the earth formation during the incremental rotation. The method further includes determining the forces on the cutters during the incremental rotation based on data from a cutter/formation interaction model and the calculated interaction between the bit and the earth formation.

The cutter formation interaction model may comprise empirical data obtained from cutter/formation interaction tests conducted for one or more cutters on one or more different formations in one or more different orientations. In alternative embodiments, the data from the cutter/formation interaction model is obtained from a numerical model developed to characterize the cutting relationship between a selected cutter and a selected earth formation. In one or more embodiments, the method described above is embodied in a computer program and the program also includes subroutines for generating a visual displays representative of the performance of the fixed cutter drill bit drilling earth formations.

In one or more embodiments, the interaction between cutters on a fixed cutter bit and an earth formation during drilling is determined based on data stored in a look up table or database. In one or more preferred embodiments, the data is empirical data obtained from cutter/formation interaction tests, wherein each test involves engaging a selected cutter on a selected earth formation sample and the tests are performed to characterize cutting actions between the selected cutter and the selected formation during drilling by a fixed cutter drill bit. The tests may be conducted for a plurality of different cutting elements on each of a plurality of different earth formations to obtain a "library" (i.e., organized database) of cutter/formation interaction data. The data may then be used to predict interaction between cutters and earth formations during simulated drilling. The collection of data recorded and stored from interaction tests will collectively be referred to as a cutter/formation interaction model.

Cutter/Formation Interaction Model

Those skilled in the art will appreciate that cutters on fixed cutter bits remove earth formation primarily by shearing and scraping action. The force required on a cutter to shear an earth formation is dependent upon the area of contact between the cutter and the earth formation, depth of cut, the contact edge length of the cutter, as well as the orientation of the cutting face with respect to the formation (e.g., back rake angle, side rake angle, etc.).

Figure 7:
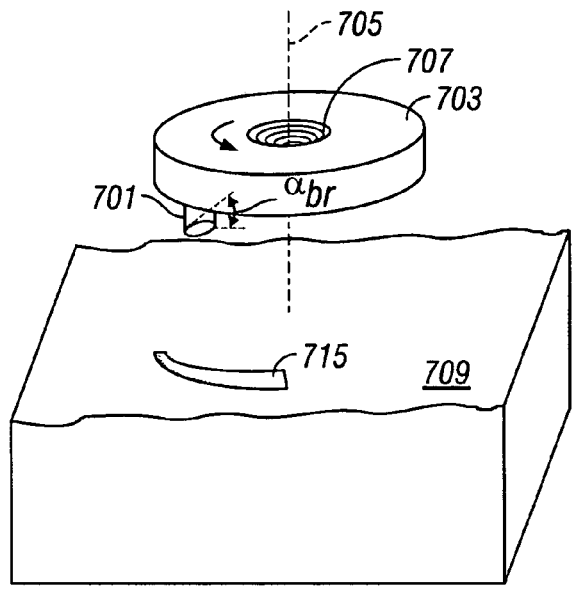
FIG. 7 shows an example of an experimental cutter/formation test set up with aspects of cutter/formation interaction and the cutter coordinate system illustrated in FIGS. 7A-7D.
Figure 7A:
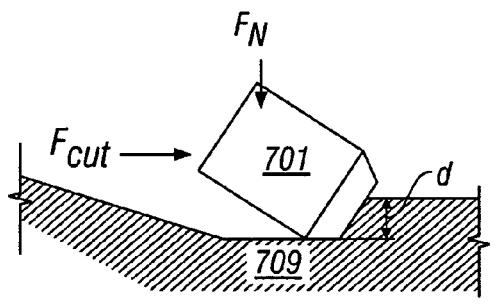
Figure 7B:
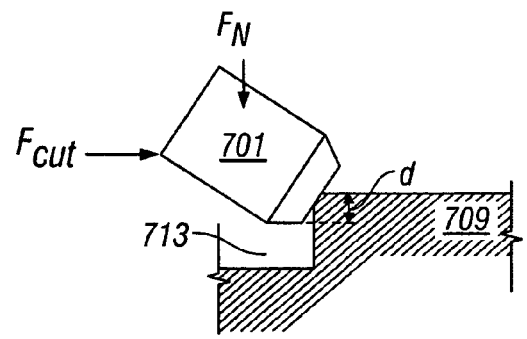

Cutter/formation interaction data in accordance with one aspect of the present invention may be obtained, for example, by performing tests. A cutter/formation interaction test should be designed to simulate the scraping and shearing action of a cutter on a fixed cutter drill bit drilling in earth formation. One example of a test set up for obtaining cutter/formation interaction data is shown in FIG. 7. In the test set up shown in FIG. 7, a cutter 701 is secured to a support member 703 at a location radially displaced from a central axis 705 of rotation for the support member 703. The cutter 701 is oriented to have a back rake angle $\alpha_{br}$ and side rake angle $\alpha_{sr}$ (illustrated in FIG. 5B). The support member 703 is mounted to a positioning device that enables the selective positing of the support member 703 in the vertical direction and enables controlled rotation of the support member 703 about the central axis 705.

Figure 7C:
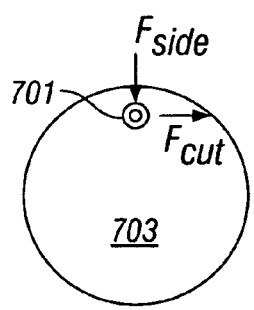
Figure 7D:
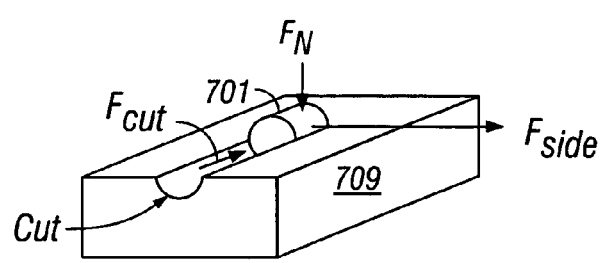

For a cutter/formation test illustrated, the support member 703 is mounted to the positioning device (not shown), with the cutter side face down above a sample of earth formation 709. The vertical position of the support member 703 is adjusted to apply the cutter 701 on the earth formation 709. The cutter 701 is preferably applied against the formation sample a desired "depth of cut" (depth below the formation surface). For example, as illustrated in FIG. 12A, the cutter 701 may be applied to the surface of the earth formation 709 with a downward force, $F_N$, and then the support member (703 in FIG. 7) rotated to force the cutter 701 to cut into the formation 709 until the cutter 701 has reached the desired depth of cut, d. Rotation of the support member results in a cutting force, $F_{cut}$, and a side force, $F_{side}$, (see FIG. 7C) applied to the cutter 701 to force the cutter 701 to cut through the earth formation 709. As illustrated in FIG. 12B, alternatively, to position the cutter 701 at the desired depth of cut, d, with respect to the earth formation 709 a groove 713 may be formed in the surface of the earth formation 709 and the cutter 701 positioned within the groove 713 at a desired depth of cut, and then forces applied to the cutter 701 to force it to cut through the earth formation 709 until its cutting face is completely engaged with earth formation 709.

Referring back to FIG. 7, once the cutter 701 is fully engaged with the earth formation 709 at the desired depth of cut, the support member 703 is locked in the vertical position to maintain the desired depth of cut. The cutter 701 is then forced to cut through the earth formation 709 at the set depth of cut by forcibly rotating the support member 703 about its axis 705, which applies forces to the cutter 701 causing it to scrape and shear the earth formation 709 in its path. The forces required on the cutter 701 to cut through the earth formation 709 are recorded along with values for other parameters and other information to characterize the resulting cutter interaction with the earth formation during the test.

Figure 11:
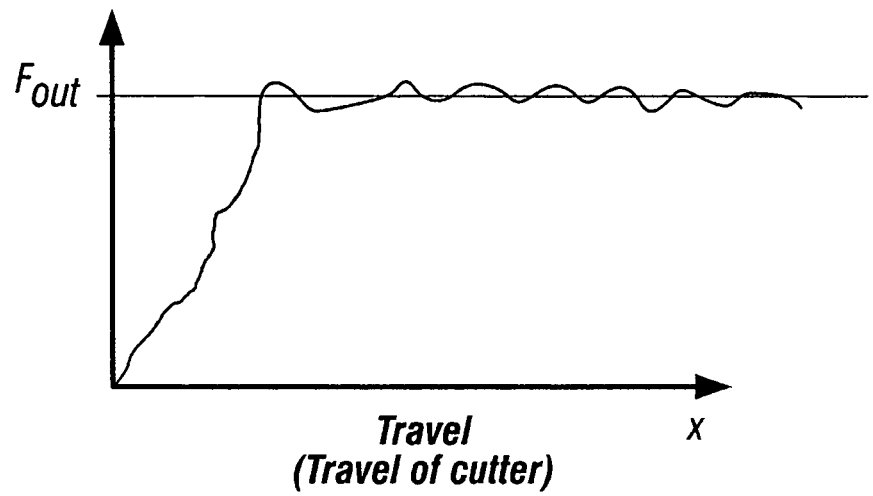
FIG. 11 shows a graphical representation of the relationship between a cut force (force in direction of cut) on a cutter and the displacement or distance traveled by the cutter during a cutter/formation interact test.
Figure 13:
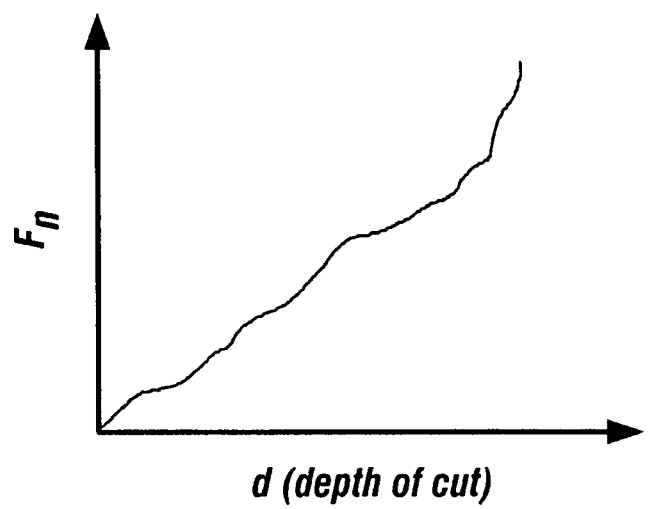
FIG. 13 shows one example of a general relationship between normal force on a cutter versus the depth of cut curve which relates to cutter/formation tests.
Figure 14:
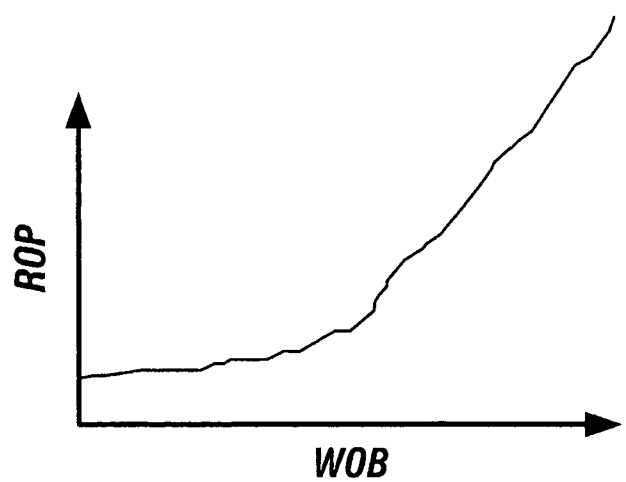
FIG. 14 shows one example of a rate of penetration versus weight on bit obtained for a selected fixed cutter drilling selected formations.

An example of the cut force, $F_{cut}$, required on a cutter in a cutting direction to force the cutter to cut through earth formation during a cutter/formation interaction test is shown in FIG. 11. As the cutter is applied to the earth formation, the cut force applied to the cutter increases until the cutting face is moved into complete contact with the earth formation at the desired depth of cut. Then the force required on the cutter to cut through the earth formation becomes substantially constant. This substantially constant force is the force required to cut through the formation at the set depth of cut and may be approximated as a constant value indicated as $F_{cut}$ in FIG. 11. FIG. 13 shows one example of a general relationship between normal force on a cutter versus the depth of cut which illustrates that the higher the depth of cut desired the higher the normal force required on the cutter to cut at the depth of force.

Figure 5:
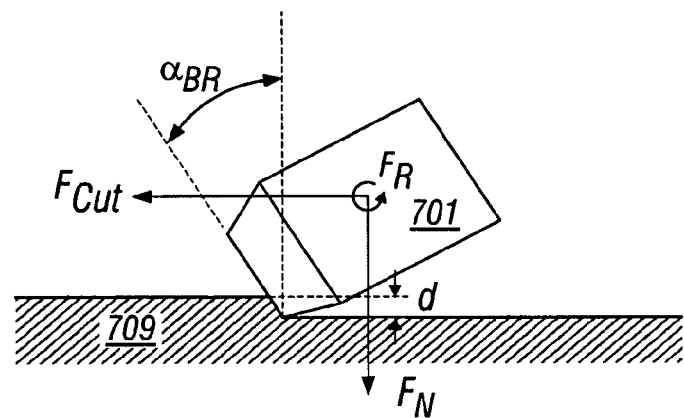
FIG. 5 shows an example of a force required on a cutter to cut through an earth formation being resolved into components in a Cartesian coordinate system along with corresponding parameters that can be used to describe cutter/formation interaction during drilling.
Figure 5A:
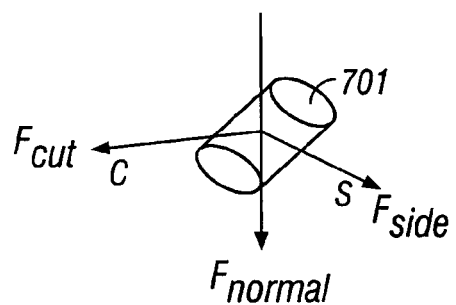
FIGS. 5A and 5B show a perspective view and a top view of the cutter illustrated in FIG. 5.
Figure 5B:
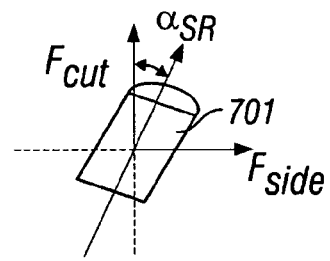

The total force required on the cutter to cut through earth formation can be resolved into components in any selected coordinate system, such as the Cartesian coordinate system shown in FIGS. 5 and 7A-7C. As shown in FIG. 5, the force on the cutter can be resolved into a normal component (normal force), $F_N$, a cutting direction component (cut force), $F_{cut}$, and a side component (side force), $F_{side}$. In the cutter coordinate system shown in FIG. 5, the cutting axis is positioned along the direction of cut. The normal axis is normal to the direction of cut and generally perpendicular to the surface of the earth formation 709 interacting with the cutter. The side axis is parallel to the surface of the earth formation 709 and perpendicular to the cutting axis. The origin of this cutter coordinate system is shown positioned at the center of the cutter 701.

As previously stated, other information is also recorded for each cutter/formation test to characterize the cutter, the earth formation, and the resulting interaction between the cutter and the earth formation. The information recorded to characterize the cutter may include any parameters useful in describing the geometry and orientation of the cutter. The information recorded to characterize the formation may include the type of formation, the confining pressure on the formation, the temperature of the formation, the compressive strength of the formation, etc. The information recorded to characterize the interaction between the selected cutter and the selected earth formation for a test may include any parameters useful in characterizing the contact between the cutter and the earth formation and the cut resulting from the engagement of the cutter with the earth formation.

One example of a record 501 of data stored for an experimental cutter/formation test is shown in FIG. 10A. The data stored in the record 501 to characterize cutter geometry and orientation includes the back rake angle, side rake angle, cutter type, cutter size, cutter shape, and cutter bevel size, cutter profile angle, the cutter radial and height locations with respect to the axis of rotation, and a cutter base height. The information stored in the record to characterize the earth formation being drilled includes the type of formation. The record 501 may additionally include the mechanical and material properties of the earth formation to be drilled, but it is not essential that the mechanical or material properties be known to practice the invention. The record 501 also includes data characterizing the cutting interaction between the cutter and the earth formation during the cutter/formation test, including the depth of cut, d, the contact edge length, e, and the interference surface area, a. The volume of formation removed and the rate of cut (e.g., amount of formation removed per second) may also be measured and recorded for the test. The parameters used to characterize the cutting interaction between a cutter and an earth formation will be generally referred to as "interaction parameters".

Depth of cut, d, contact edge length, e, and interference surface area, a, for a cutter cutting through earth formation are illustrated for example in FIGS. 8A and 9A, with the corresponding formations cut being illustrated in FIGS. 8B and 9B, respectively. Referring primarily to FIG. 8A, for a cutter 801 cutting through earth formation (803 in FIG. 8B), the depth of cut or, d is the distance below the earth formation surface that the cutter penetrates into the earth formation. The interference surface area, a, is the surface area of contact between the cutter and the earth formation during the cut. Interference surface area may be expressed as a fraction of the total area of the cutting surface, in which case the interference surface area will generally range from zero (no interference or penetration) to one (full penetration). The contact edge length, e, is the distance between furthest points on the edge of the cutter in contact with formation at the earth formation surface.

The data stored for the cutter/formation test uniquely characterizes the actual interaction between a selected cutter and earth formation pair. A complete library of cutter/formation interaction data can be obtained by repeating tests as described above for each of a plurality of selected cutters with each of a plurality of selected earth formations. For each cutter/earth formation pair, a series of tests can be performed with the cutter in different orientations (different back rake angles, side rake angles, etc.) with respect to the earth formation. A series of tests can also be performed for a plurality of different depths of cut into the formation. The data characterizing each test is stored in a record and the collection of records can be stored in a database for convenient retrieval.

Figure 10B:
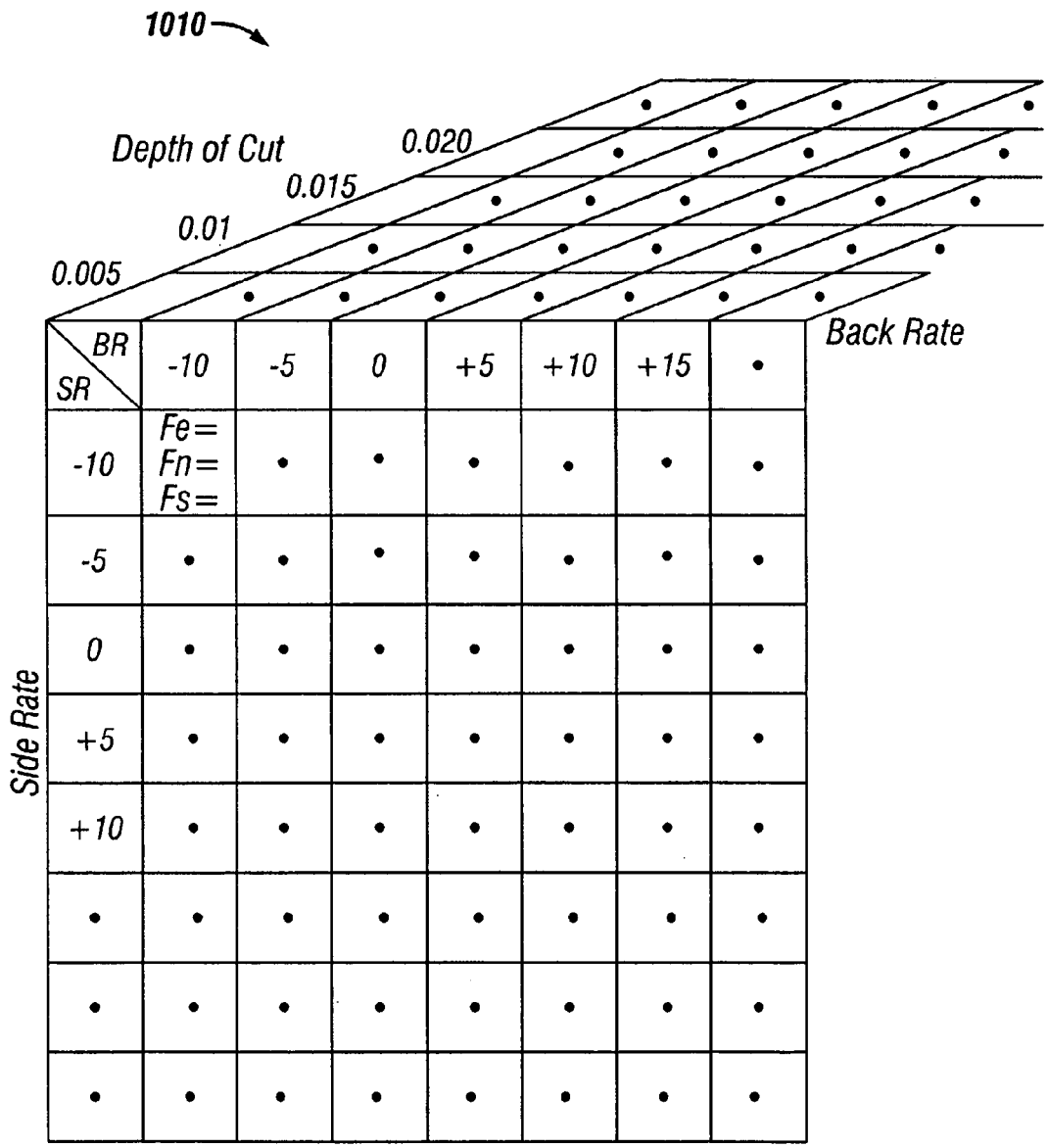

FIG. 10B shows, an exemplary illustration of a cutter/formation interaction data obtained from a series of tests conducted for a selected cutter and on selected earth formation. As shown in FIG. 10B, the cutter/formation test were repeated for a plurality of different back rake angles (e.g., −10°, −5°, 0°, +5°, +10°, etc.) and a plurality of different side rack angles (e.g., −10°, −5°, 0°, +50, +100, etc.). Additionally, tests were repeated for different depths of cut into the formation (e.g., 0.005", 0.01", 0.015", 0.020", etc.) at each orientation of the cutter. The data obtained from tests involving the same cutter and earth formation pair may be stored in a multi-dimensional table (or sub-database) as shown. Tests are repeated for the same cutter and earth formation as desired until a sufficient number of tests are performed to characterize the expected interactions between the selected cutter and the selected earth formation during drilling. For a selected cutter and earth formation pair, preferably a sufficient number of tests are performed to characterize at least a relationship between depth of cut, amount of formation removed, and the force required on the cutter to cut through the selected earth formation. More comprehensively, the cutter/formation interaction data obtained from tests characterize relationships between a cutter's orientation (e.g., back rake and side rake angles), depth of cut, area of contact, edge length of contact, and geometry (e.g., bevel size and shape (angle), etc.) and the resulting force required on the cutter to cut through a selected earth formation. Series of tests are also performed for other selected cutters/formations pairs and the data obtained are stored, as described above. The resulting library or database of cutter/formation data may then be used to accurately predict interaction between specific cutters and specific earth formations during drilling, as will be further described below.

Cutter/formation interaction records generated numerically are also within the scope of the present invention. For example, in one implementation, cutter/formation interaction data is obtained theoretically based on solid mechanics principles applied to a selected cutting element and a selected formation. A numerical method, such as finite element analysis or finite difference analysis, may be used to numerically simulate a selected cutter, a selected earth formation, and the interaction between the cutter and the earth formation. In one implementation, selected formation properties are characterized in the lab to provide an accurate description of the behavior of the selected formation. Then a numerical representation of the selected earth formation is developed based on solid mechanics principles. The cutting action of the selected cutter against the selected formation is then numerically simulated using the numerical models and interaction criteria (such as the orientation, depth of cut, etc.) and the results of the "numerical" cutter/formation tests are recorded and stored in a record, similar to that shown in FIG. 10A. The numerical cutter/formation tests are then repeated for the same cutter and earth formation pair but at different orientations of the cutter with respect to the formation and at different depths of cut into the earth formation at each orientation. The values obtained from numerical cutter/formation tests are then stored in a multi-dimensional table as illustrated in FIG. 10B.

Laboratory tests are performed for other selected earth formations to accurately characterize and obtain numerical models for each earth formation and additional numerical cutter/formation tests are repeated for different cutters and earth formation pairs and the resulting data stored to obtain a library of interaction data for different cutter and earth formation pairs. The cutter/formation interaction data obtained from the numerical cutter/formation tests are uniquely obtained for each cutter and earth formation pair to produce data that more accurately reflects cutter/formation interaction during drilling.

Cutter/formation interaction models as described above can be used to accurately model interaction between one or more selected cutters and one or more selected earth formation during drilling. Once cutter/formation interaction data are stored, the data can be used to model interaction between selected cutters and selected earth formations during drilling. During simulations wherein data from a cutter/formation interaction library is used to determine the interaction between cutters and earth formations, if the calculated interaction (e.g., depth of cut, contact areas, engagement length, actual back rake, actual side rake, etc. during simulated cutting action) between a cutter and a formation falls between data values experimentally or numerically obtained, linear interpolation or other types of best-fit functions can be used to calculate the values corresponding to the interaction during drilling. The interpolation method used is a matter of convenience for the system designer and not a limitation of the invention. In other embodiments, cutter/formation interaction tests may be conducted under confining pressure, such as hydrostatic pressure, to more accurately represent actual conditions encountered while drilling. Cutting element/formation tests conduced under confining pressures and in simulated drilling environments to reproduce the interaction between cutting elements and earth formations for roller cone bits is disclosed in U.S. Pat. No. 6,516,293 which is assigned to the assignee of the present invention and incorporated herein by reference.

As previously explained, it is not necessary to know the mechanical properties of any of the earth formations for which laboratory tests are performed to use the results of the tests to simulate cutter/formation interaction during drilling. The data can be accessed based on the type of formation being drilled. However, if formations which are not tested are to have drilling simulations performed for them, it is preferable to characterize mechanical properties of the tested formations so that expected cutter/formation interaction data can be interpolated for untested formations based on the mechanical properties of the formation. As is well known in the art, the mechanical properties of earth formations include, for example, compressive strength, Young's modulus, Poisson's ration and elastic modulus, among others. The properties selected for interpolation are not limited to these properties.

The use of laboratory tests to experimentally obtain cutter/formation interaction may provide several advantages. One advantage is that laboratory tests can be performed under simulated drilling conditions, such as under confining pressure to better represent actual conditions encountered while drilling. Another advantage is that laboratory tests can provide data which accurately characterize the true interaction between actual cutters and actual earth formations. Another advantage is that laboratory tests can take into account all modes of cutting action in a formation resulting from interaction with a cutter. Another advantage is that it is not necessary to determine all mechanical properties of an earth formation to determine the interaction of a cutter with the earth formation. Another advantage is that it is not necessary to develop complex analytical models for approximating the behavior of an earth formation or a cutter based on the mechanical properties of the formation or cutter and forces exhibited by the cutter during interacting with the earth formation.

Cutter/formation interaction models as described above can be used to provide a good representation of the actual interaction between cutters and earth formations under selected drilling conditions.

Figure 2:
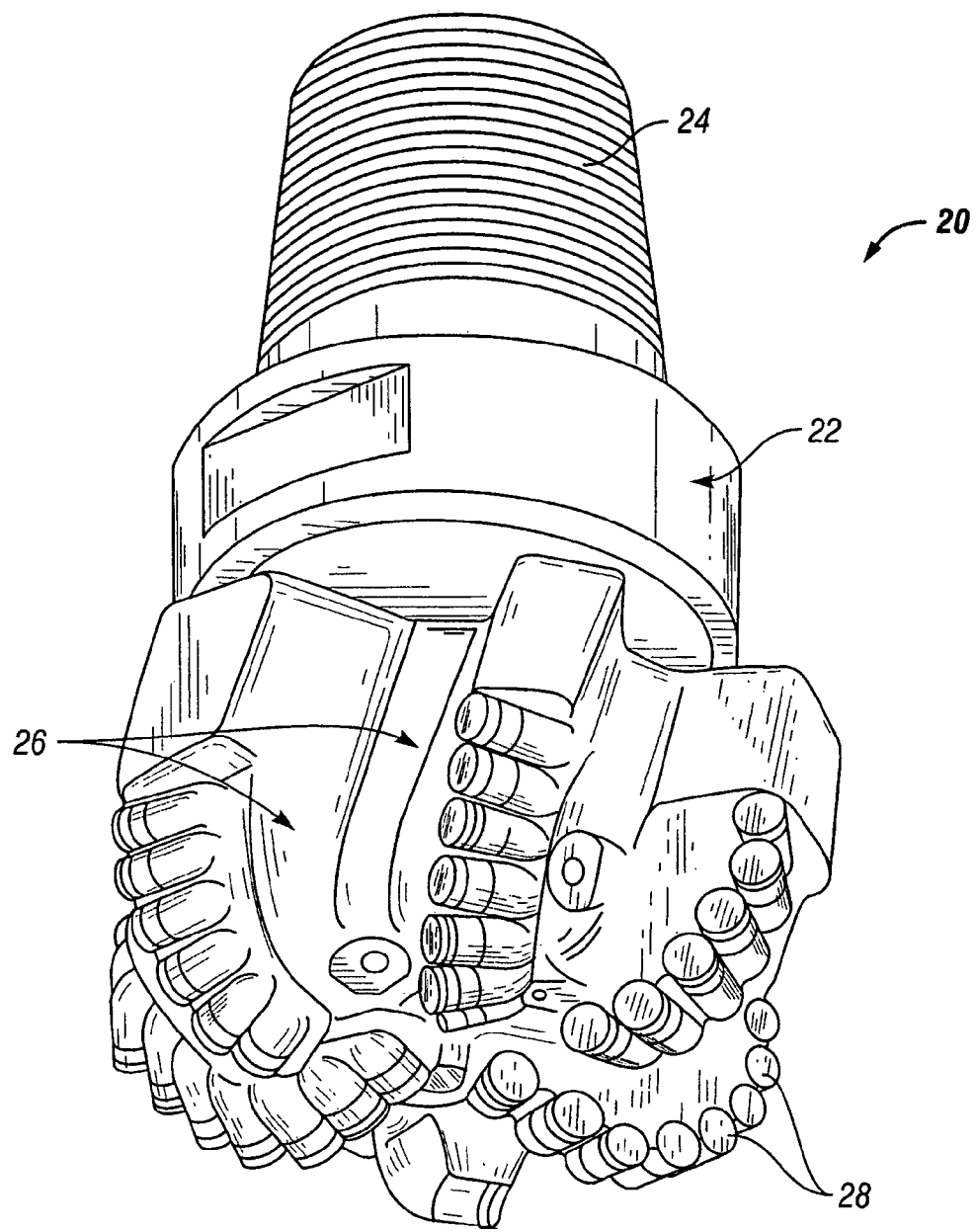
FIG. 2 shows a perspective view of a prior art fixed cutter drill bit.

As illustrated in the comparison of FIGS. 8A-8B with FIGS. 9A-9B, it can be seen that when a cutter engages an earth formation presented as a smooth, planar surface (803 in FIG. 8A), the interference surface area, a, (in FIG. 8A) is the fraction of surface area corresponding to the depth of cut, d. However, in the case of an earth formation surface having cuts formed therein by previous cutting elements (805 in FIG. 9A), as is typically the case during drilling, subsequent contact of a cutter on the earth formation can result in an interference surface area that is equal to less than the surface area, a, corresponding to the depth of cut, d, as illustrated in FIG. 9A. This "partial interference" will result in a lower force on the cutter than if the complete surface area corresponding to the depth of cut contacted formation. In such case, an equivalent depth of cut and an equivalent contact edge length may be calculated, as shown in FIGS. 9C-1 and 9C-2, to correspond to the partial interference. This point will be described further below with respect to use of cutter/formation data for predicting the drilling performance of fixed cutter drill bits.

Modeling the Performance of Fixed Cutter Bits

In one or more embodiments of the invention, force or wear on at least one cutter on a bit, such as during the simulation of a bit drilling earth formation is determined using cutter/formation interaction data in accordance with the description above.

Figure 3:
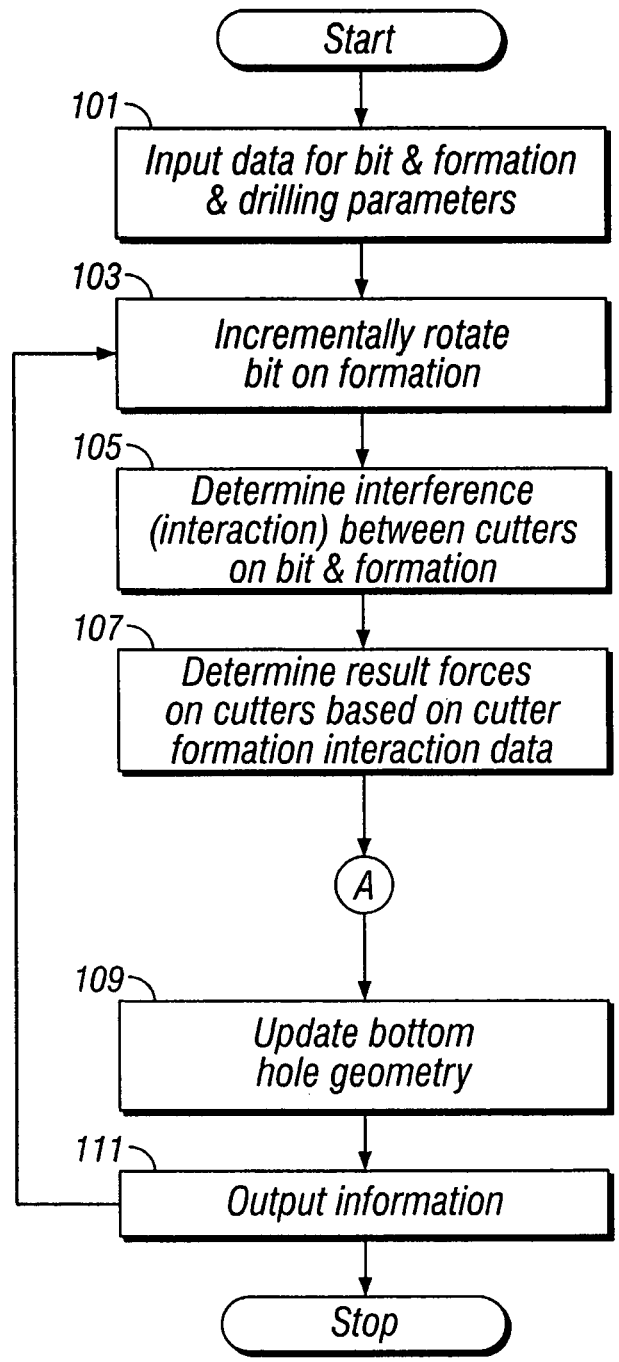
FIG. 3 shows a flowchart of a method for modeling the performance of a fixed cutter bit during drilling in accordance with one or more embodiments of the invention.

One example of a method that may be used to model a fixed cutter drill bit drilling earth formation is illustrated in FIG. 3. In this embodiment, the method includes accepting as input parameters for a bit, an earth formation to be drilled, and drilling parameters, 101. The method generates a numerical representation of the bit and a numerical representation of the earth formation and simulates the bit drilling in the earth formation by incrementally rotating the bit (numerically) on the formation, 103. The interference between the cutters on the bit and the earth formation during the incremental rotation are determined, 105, and the forces on the cutters resulting from the interference are determined, 107. Finally, the bottomhole geometry is updated to remove the formation cut by the cutters, as a result of the interference, during the incremental rotation, 109. Results determined during the incremental rotation are output, 111. The steps of incrementally rotating 103, calculating 105, determining 107, and updating 109 are repeated to simulate the drill bit drilling through earth formations with results determined for each incremental rotation being provided as output 111.

Figure 3A:
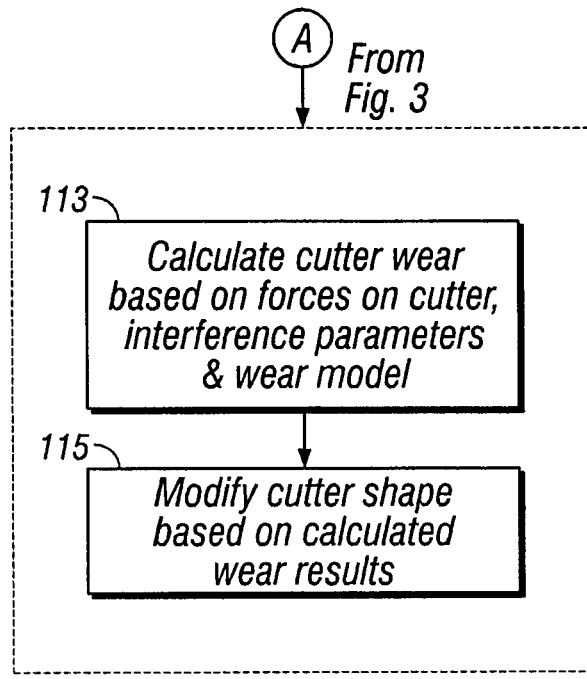
FIG. 3A shows additional method steps that may be included in the method shown in FIG. 3 to model wear on the cutters of the fixed cutter bit during drilling in accordance with one or more embodiments of the invention.

As illustrated in FIG. 3A, for each incremental rotation the method may further include calculating cutter wear based on forces on the cutters, the interference of the cutters with the formation, and a wear model 113, and modifying cutter shapes based on the calculated cutter wear 115. These steps may be inserted into the method at the point indicated by the node labeled "A." Calculation or modeling of cutter or bit wear will be described in more detail in a later section.

Figure 4A:
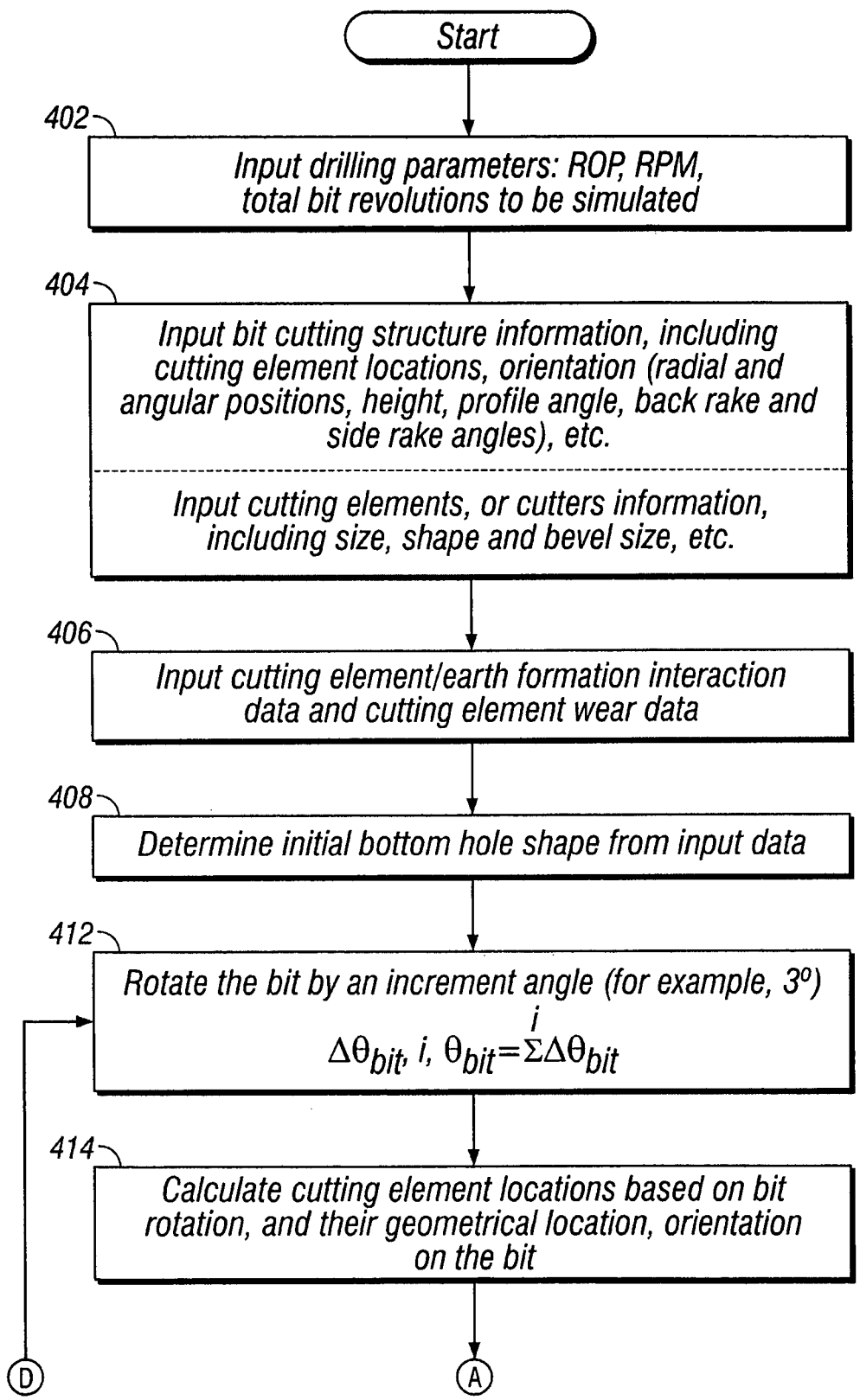
FIGS. 4A-4C show a flowchart of a method for modeling the drilling performance of a fixed cutter bit in accordance with one embodiment of the invention.
Figure 4B:
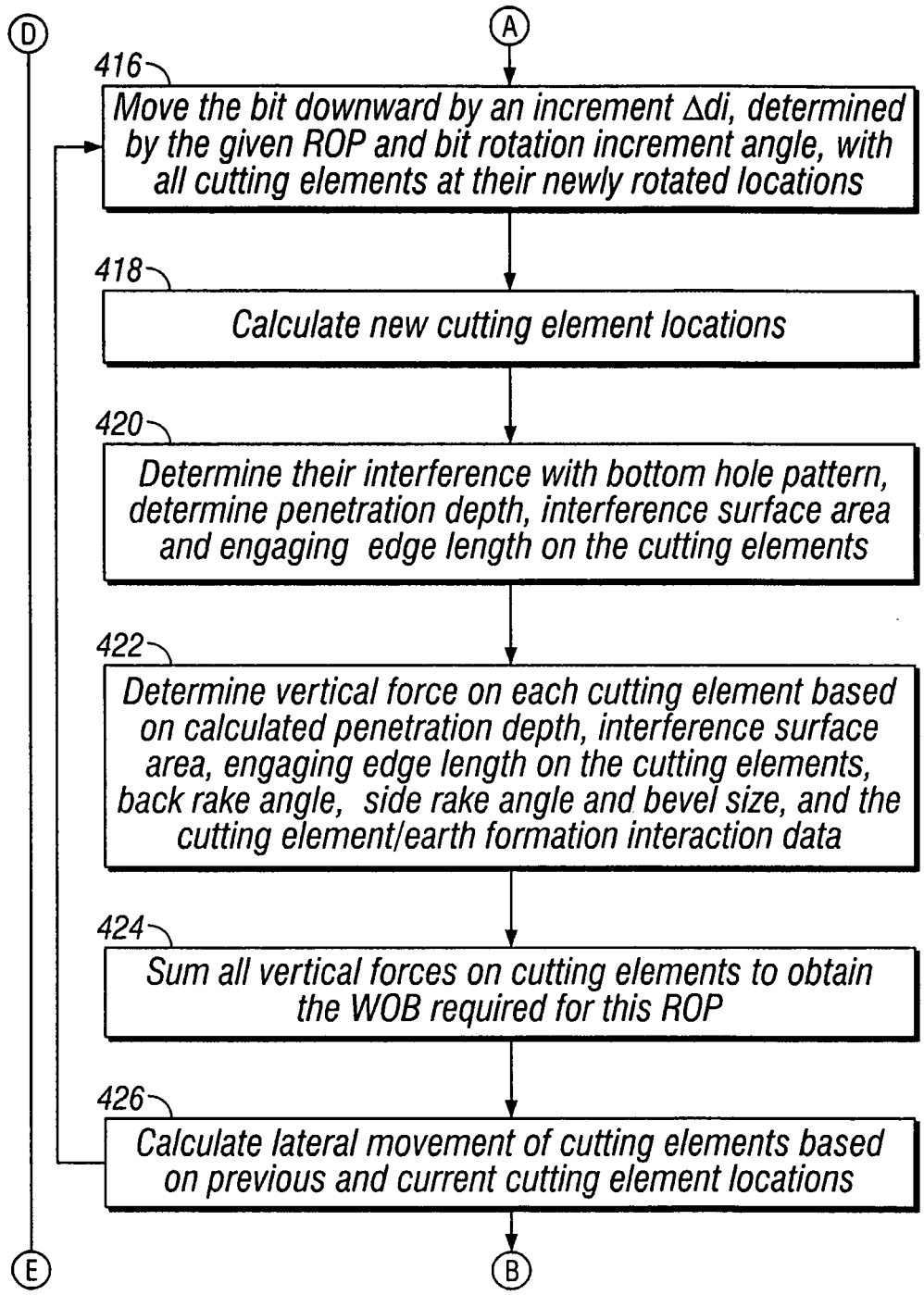
Figure 4C:
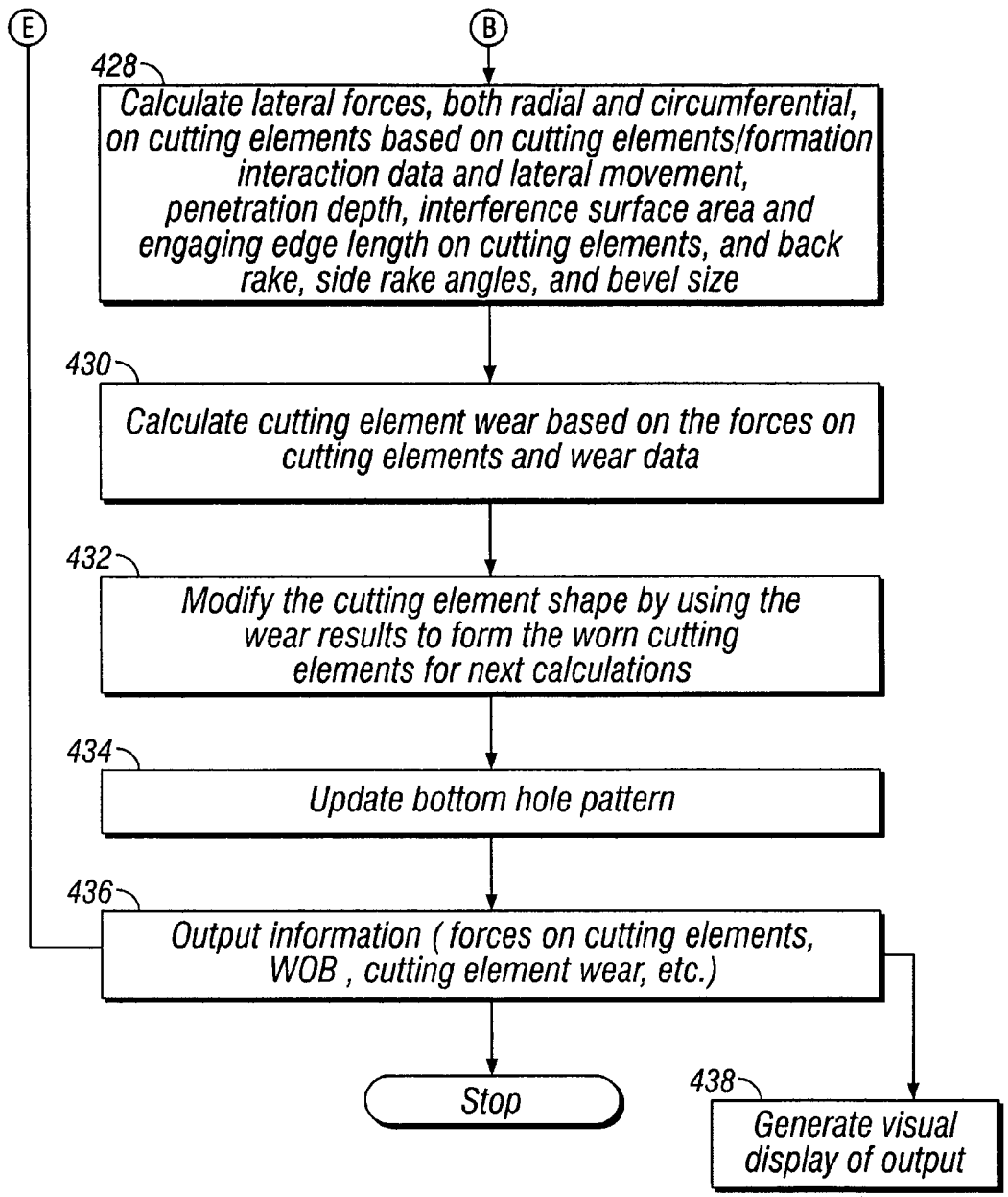

A flowchart for one implementation of a method developed in accordance with this aspect of the invention is shown, for example, in FIGS. 4A-4C. This method was developed to model drilling based on ROP control. As shown in 4A, the method includes selecting or otherwise inputting parameters for a dynamic simulation. Parameters provided as input include drilling parameters 402, bit design parameters 404, cutter/formation interaction data and cutter wear data 406, and bottomhole parameters for determining the initial bottomhole shape at 408. The data and parameters provided as input for the simulation can be stored in an input library and retrieved as need during simulation calculations.

Drilling parameters 402 may include any parameters that can be used to characterize drilling. In the method shown, the drilling parameters 402 provided as input include the rate of penetration (ROP) and the rotation speed of the drill bit (revolutions per minute, RPM).

Bit design parameters 404 may include any parameters that can be used to characterize a bit design. In the method shown, bit design parameters 404 provided as input include the cutter locations and orientations (e.g., radial and angular positions, heights, profile angles, bake rake angles, side rake angles, etc.) and the cutter sizes (e.g., diameter), shapes (i.e., geometry) and bevel size. Additional bit design parameters 404 may include the bit profile, bit diameter, number of blades on bit, blade geometries, blade locations, junk slot areas, bit axial offset (from the axis of rotation), cutter material make-up (e.g., tungsten carbide substrate with hardfacing overlay of selected thickness), etc. Those skilled in the art will appreciate that cutter geometries and the bit geometry can be meshed, converted to coordinates and provided as numerical input. Preferred methods for obtaining bit design parameters 404 for use in a simulation include the use of 3-dimensional CAD solid or surface models for a bit to facilitate geometric input.

Cutter/formation interaction data 406 includes data obtained from experimental tests or numerically simulations of experimental tests which characterize the actual interactions between selected cutters and selected earth formations, as previously described in detail above. Wear data 406 may be data generated using any wear model known in the art or may be data obtained from cutter/formation interaction tests that included an observation and recording of the wear of the cutters during the test. A wear model may comprise a mathematical model that can be used to calculate an amount of wear on the cutter surface based on forces on the cutter during drilling or experimental data which characterizes wear on a given cutter as it cuts through the selected earth formation. U.S. Pat. No. 6,619,411 issued to Singh et al. discloses methods for modeling wear of roller cone drill bits. This patent is assigned to the present assignee and is incorporated by reference in its entirety. Wear modeling for fixed cutter bits (e.g., PDC bits) will be described in a later section. Other patents related wear simulation include U.S. Pat. Nos. 5,042,596, 5,010,789, 5,131,478, and 4,815,342. The disclosures of these patents are incorporated by reference.

Bottomhole parameters used to determine the bottomhole shape at 408 may include any information or data that can be used to characterize the initial geometry of the bottomhole surface of the well bore. The initial bottomhole geometry may be considered as a planar surface, but this is not a limitation on the invention. Those skilled in the art will appreciate that the geometry of the bottomhole surface can be meshed, represented by a set of spatial coordinates, and provided as input. In one implementation, a visual representation of the bottomhole surface is generated using a coordinate mesh size of 1 millimeter.

Once the input data (402, 404, 406) is entered or otherwise made available and the bottomhole shape determined (at 408), the steps in a main simulation loop 410 can be executed. Within the main simulation loop 410, drilling is simulated by "rotating" the bit (numerically) by an incremental amount, $\Delta\theta_{bit,i}$, 412. The rotated position of the bit at any time can be expressed as $$\theta_{bit} = \sum^{i} \Delta\theta_{bit,i},$$

412. $\Delta\theta_{bit,i}$ may be set equal to 3 degrees, for example. In other implementations, $\Delta\theta_{bit,i}$ may be a function of time or may be calculated for each given time step. The new location of each of the cutters is then calculated, 414, based on the known incremental rotation of the bit, $\Delta\theta_{bit,i}$, and the known previous location of each of the cutters on the bit. At this step, 414, the new cutter locations only reflect the change in the cutter locations based on the incremental rotation of the bit. The newly rotated location of the cutters can be determined by geometric calculations known in the art.

As shown at the top of FIG. 4B, the axial displacement of the bit, $\Delta d_{bit,i}$, during the incremental rotation is then determined, 416. In this implementation the rate of penetration (ROP) was provided as input data (at 402), therefore axial displacement of the bit is calculated based on the given ROP and the known incremental rotation angle of the bit. The axial displacement can be determined by geometric calculations known in the art. For example, if ROP is given in ft/hr and rotation speed of the bit is given in revolutions per minute (RPM), the axial displacement, $\Delta d_{bit,i}$, of the bit resulting for the incremental rotation, $\Delta\theta_{bit,i}$, may be determined using an equation such as:

$$\Delta d_{bit,i} = \frac{(ROP_i/RPM_i)}{60} \cdot (\Delta\theta_{bit,i}).$$

Once the axial displacement of the bit, $\Delta d_{bit,i}$, is determined, the bit is "moved" axially downward (numerically) by the incremental distance, $\Delta d_{bit,i}$, 416 (with the cutters at their newly rotated locations calculated at 414). Then the new location of each of the cutters after the axial displacement is calculated 418. The calculated location of the cutters now reflects the incremental rotation and axial displacement of the bit during the "increment of drilling". Then each cutter interference with the bottomhole is determined, 420. Determining cutter interaction with the bottomhole includes calculating the depth of cut, the interference surface area, and the contact edge length for each cutter contacting the formation during the increment of drilling by the bit. These cutter/formation interaction parameters can be calculated using geometrical calculations known in the art.

Figure 12:
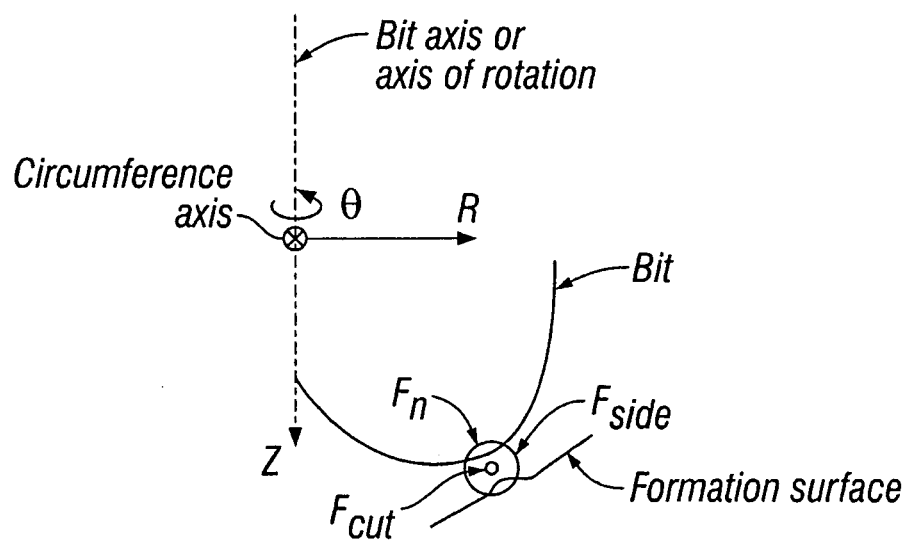
FIG. 12 shows one example of a bit coordinate system showing cutter forces on a cutter of a bit in the bit coordinate system.

Once the correct cutter/formation interaction parameters are determined, the axial force on each cutter (in the Z direction with respect to a bit coordinate system as illustrated in FIG. 12) during increment drilling step, i, is determined, 422. The force on each cutter is determined from the cutter/formation interaction data based on the calculated values for the cutter/formation interaction parameters and cutter and formation information.

Referring to FIG. 12, the normal force, cutting force, and side force on each cutter is determined from cutter/formation interaction data based on the known cutter information (cutter type, size, shape, bevel size, etc.), the selected formation type, the calculated interference parameters (i.e., interference surface area, depth of cut, contact edge length) and the cutter orientation parameters (i.e., back rake angle, side rake angle, etc.). For example, the forces are determined by accessing cutter/formation interaction data for a cutter and formation pair similar to the cutter and earth formation interacting during drilling. Then the values calculated for the interaction parameters (depth of cut, interference surface area, contact edge length, back rack, side rake, and bevel size) during drilling are used to look up the forces required on the cutter to cut through formation in the cutter/formation interaction data. If values for the interaction parameters do not match values contained in the cutter/formation interaction data, records containing the most similar parameters are used and values for these most similar records are used to interpolate the force required on the cutting element during drilling.

In cases during drilling wherein the cutting element makes less than full contact with the earth formation due to grooves in the formation surface made by previous contact with cutters, illustrated in FIGS. 9A and 9B, an equivalent depth of cut and an equivalent contact edge length can be calculated to correspond to the interference surface area, as shown in FIGS. 9C-1 and 9C-2, and used to look up the force required on the cutting element during drilling.

In one implementation, an equivalent contact edge length, $e_{ej,i}$, and an equivalent depth of cut, $d_{ej,i}$, are calculated to correspond to the interference surface area, $a_{j,i}$, calculated for cutters in contact with the formation, as shown in FIGS. 9C-1 and 9C-2. Those skilled in the art will appreciate that during calculations each cutter may be considered as a collection of meshed elements and the parameters above obtained for each element in the mesh. The parameter values for each element can be used to obtain the equivalent contact edge length and the equivalent depth of cut. For example, the element values can be summed and an average taken as the equivalent contact edge length and the equivalent depth of cut for the cutter that corresponds to the calculated interference surface area. The above calculations can be carried out using numerical methods which are well known in the art.

The displacement of each of the cutters is calculated based on the previous cutter location, $p_{j,i-1}$, and the current cutter location, $p_{j,i}$, 426. As shown at the top of FIG. 4C, the forces on each cutter are then determined from cutter/formation interaction data based on the cutter lateral movement, penetration depth, interference surface area, contact edge length, and other bit design parameters (e.g., back rake angle, side rake angle, and bevel size of cutter), 428. Cutter wear is also calculated (see a later section) for each cutter based on the forces on each cutter, the interaction parameters, and the wear data for each cutter, 430. The cutter shape is modified using the wear results to form a worn cutter for subsequent calculations, 432.

Once the forces ($F_N$, $F_{cut}$, $F_{side}$) on each of the cutters during the incremental drilling step are determined, 422, these forces are resolved into bit coordinate system, $O_{ZR\theta}$, illustrated in FIG. 12, (axial (Z), radial (R), and circumferential). Then, all of the forces on the cutters in the axial direction are summed to obtain a total axial force $F_Z$ on the bit. The axial force required on the bit during the incremental drilling step is taken as the weight on bit (WOB) required to achieve the given ROP, 424.

Finally, the bottomhole pattern is updated, 434. The bottomhole pattern can be updated by removing the formation in the path of interference between the bottomhole pattern resulting from the previous incremental drilling step and the path traveled by each of the cutters during the current incremental drilling step.

Output information, such as forces on cutters, weight on bit, and cutter wear, may be provided as output information, at 436. The output information may include any information or data which characterizes aspects of the performance of the selected drill bit drilling the specified earth formations. For example, output information can include forces acting on the individual cutters during drilling, scraping movement/distance of individual cutters on hole bottom and on the hole wall, total forces acting on the bit during drilling, and the weight on bit to achieve the selected rate of penetration for the selected bit. As shown in FIG. 4C, output information is used to generate a visual display of the results of the drilling simulation, at 438. The visual display 438 can include a graphical representation of the well bore being drilled through earth formations. The visual display 438 can also include a visual depiction of the earth formation being drilled with cut sections of formation calculated as removed from the bottomhole during drilling being visually "removed" on a display screen. The visual representation may also include graphical displays, such as a graphical display of the forces on the individual cutters, on the blades of the bit, and on the drill bit during the simulated drilling. The means used for visually displaying aspects of the drilling performance is a matter of choice for the system designer, and is not a limitation on the invention.

As should be understood by one of ordinary skill in the art, the steps within the main simulation loop 410 are repeated as desired by applying a subsequent incremental rotation to the bit and repeating the calculations in the main simulation loop 410 to obtain an updated cutter geometry (if wear us modeled) and an updated bottomhole geometry for the new incremental drilling step. Repeating the simulation loop 410 as described above will result in the modeling of the performance of the selected fixed cutter drill bit drilling the selected earth formations and continuous updates of the bottomhole pattern drilled. In this way, the method as described can be used to simulate actual drilling of the bit in earth formations.

An ending condition, such as the total depth to be drilled, can be given as a termination command for the simulation, the incremental rotation and displacement of the bit with subsequent calculations in the simulation loop 410 will be repeated until the selected total depth drilled $$\left\{ e.g., \quad D = \sum^{i} \Delta d_{bit,i} \right\}$$

is reached. Alternatively, the drilling simulation can be stopped at any time using any other suitable termination indicator, such as a selected input from a user.

Figure 17A:
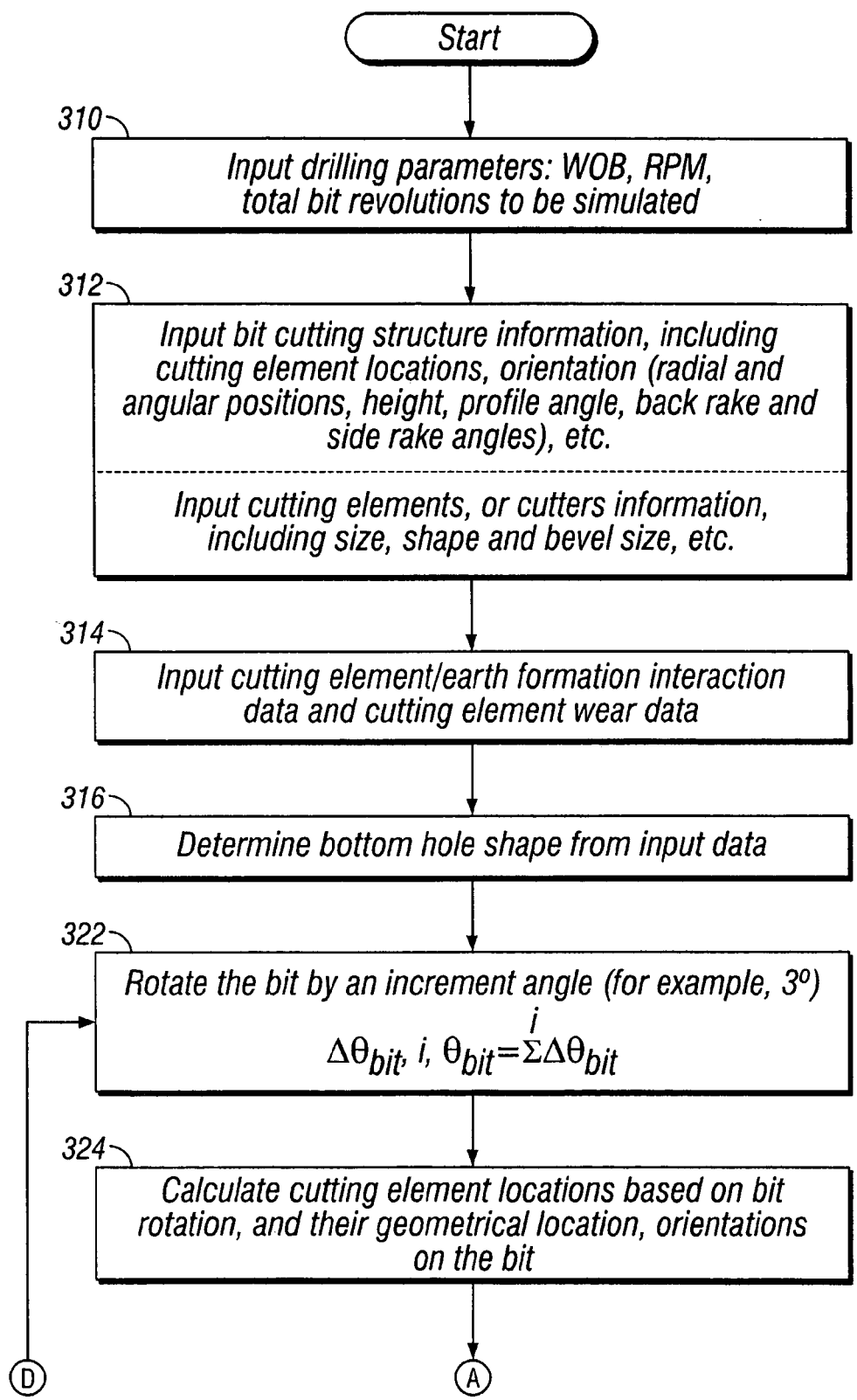
FIGS. 17A-17C show a flowchart of a method for modeling the drilling performance of a fixed cutter bit in accordance with one embodiment of the invention.
Figure 17B:
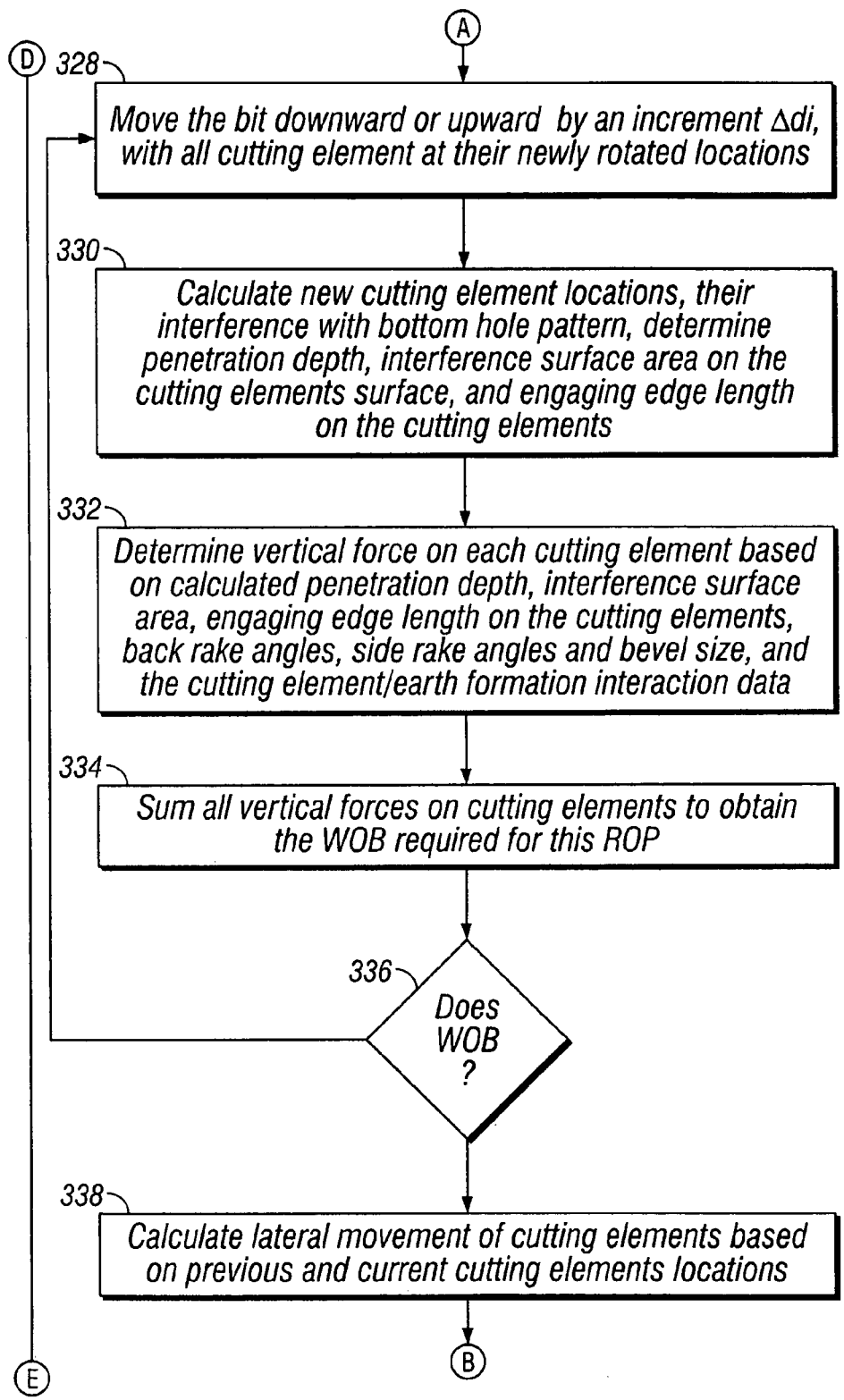
Figure 17C:
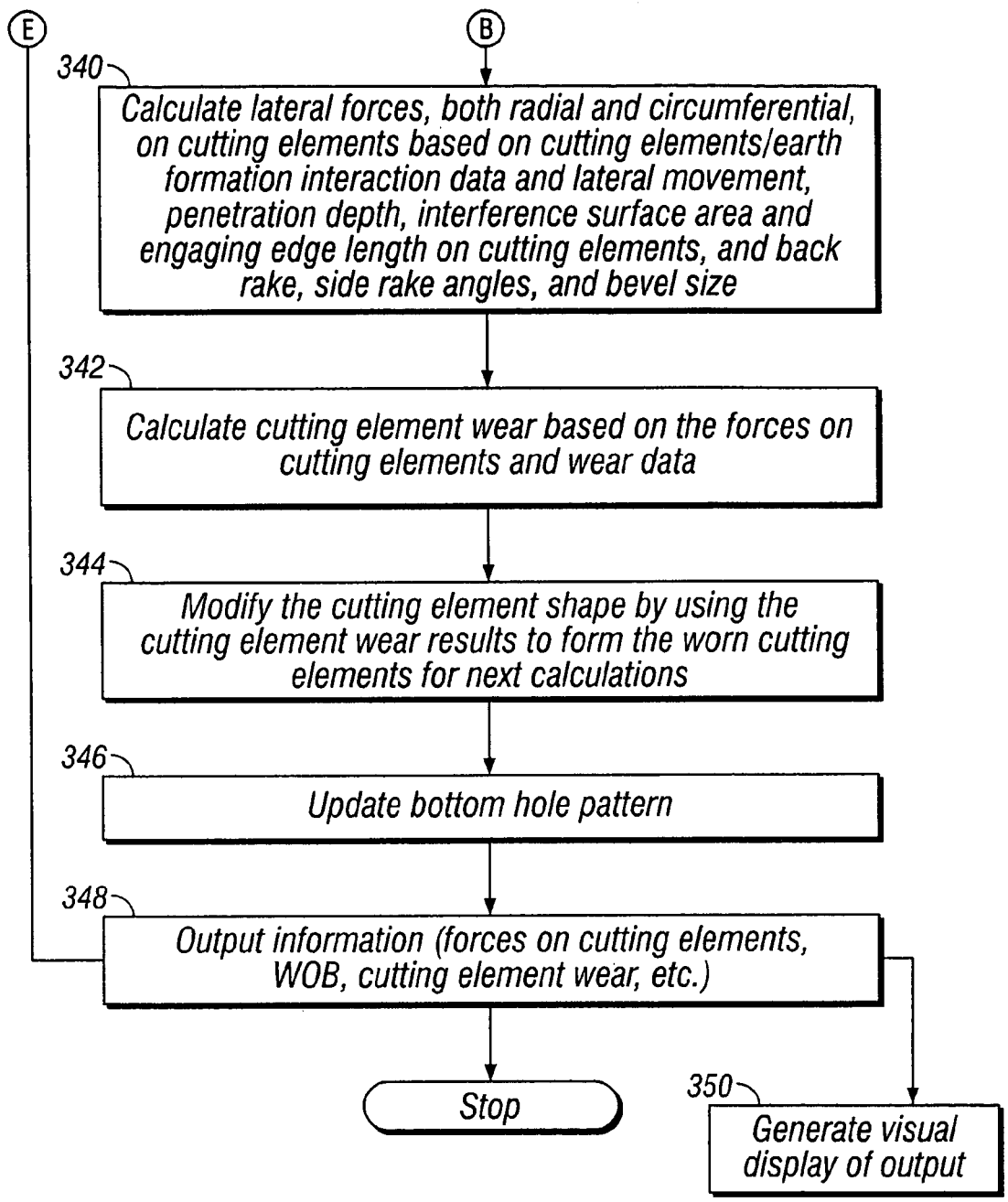

In the embodiment discussed above with reference to FIGS. 4A-4C, ROP was assumed to be provided as the drilling parameter which governed drilling. However, this is not a limitation on the invention. For example, another flowchart for method in accordance with one embodiment of the invention is shown in FIGS. 17A-17C. This method was developed to model drilling based on WOB control. In this embodiment, weight on bit (WOB), rotation speed (RPM), and the total bit revolutions to be simulated are provided as input drilling parameters, 310. In addition to these parameters, the parameters provided as input include bit design parameters 312, cutter/formation interaction data and cutter wear data 314, and bottomhole geometry parameters for determining the initial bottomhole shape 316, which have been generally discussed above.

After the input data is entered (310, 312, 314) and the bottomhole shape determined (316), calculations in a main simulation loop 320 are carried out. As discussed for the previous embodiment, drilling is simulated in the main simulation loop 320 by incrementally "rotating" the bit (numerically) through an incremental angle amount, $\Delta \theta_{bit,i}$, 322, wherein rotation of the bit at any time can be expressed as $$\theta_{bit} = \sum^{i} \Delta \theta_{bit,i}.$$

As shown in FIG. 17B, after the bit is rotated by the incremental angle, the newly rotated location of each of the cutters is calculated 324 based on the known amount of the incremental rotation of the bit and the known previous location of each cutter on the bit. At this point, the new cutter locations only account for the change in location of the cutters due to the incremental rotation of the bit. Then the axial displacement of the bit during the incremental rotation is determined. In this embodiment, the axial displacement of the bit is iteratively determined in an axial force equilibrium loop 326 based on the weight on bit (WOB) provided as input (at 310).

Referring to FIG. 17B, the axial force equilibrium loop 326 includes initially "moving" the bit vertically (i.e., axially) downward (numerically) by a selected initial incremental distance, $\Delta d_{bit,i}$ at 328. The selected initial incremental distance may be set at $\Delta d_{bit,i}=2$ mm, for example. This is a matter of choice for the system designer and not a limitation on the invention. For example, in other implementations, the amount of the initial axial displacement may be selected dependent upon the selected bit design parameters (types of cutters, etc.), the weight on bit, and the earth formation selected to be drilled.

The new location of each of the cutters due to the selected downward displacement of the bit is then calculated, 330. The cutter interference with the bottomhole during the incremental rotation (at 322) and the selected axial displacement (at 328) is also calculated, 330. Calculating cutter interference with the bottomhole, 330, includes determining the depth of cut, the contact edge length, and the interference surface area for each of the cutters that contacts the formation during the "incremental drilling step" (i.e., incremental rotation and incremental downward displacement).

Referring back to FIG. 3B, once cutter/formation interaction is calculated for each cutter based on the assumed axial displacement of the bit, the forces on each cutter due to resulting interaction with the formation for the assumed axial displacement is determined 332.

Similar to the embodiment discussed above and shown in FIGS. 4A-4C, the forces are determined from cutter/formation interaction data based on the cutter information (cutter type, size, shape, bevel size, etc.), the formation type, the calculated interference parameters (i.e., interference surface area, depth of cut, contact edge length) and the cutter orientation parameters (i.e., back rake angle, side rake angle, etc.). The forces ($F_N$, $F_{cut}$, $F_{side}$) are determined by accessing cutter/formation interaction data for a cutter and formation pair similar to the cutter and earth formation pair interacting during drilling. The interaction parameters (depth of cut, interference surface area, contact edge length, back rack, side rake, bevel size) calculated during drilling are used to look up the force required on the cutter to cut through formation in the cutter/formation interaction data. When values for the interaction parameters do not match values in the cutter/formation interaction data, for example, the calculated depth of cut is between the depth of cut in two data records, the records containing the closest values to the calculated value are used and the force required on the cutting element for the calculated depth of cut is interpolated from the data records. Those skilled in the art will appreciate that any number of methods known in the art may be used to interpolate force values based on cutter/formation interaction data records having interaction parameters closely matching with the calculated parameters during the simulation.

Also, as previously stated, in cases where a cutter makes less than full contact with the earth formation because of previous cuts in the formation surface due to contact with cutters during pervious incremental rotations, etc., an equivalent depth of cut and an equivalent contact edge length can be calculated to correspond to the interference surface area, as illustrated in FIGS. 9C-1 and 9C-2, and the equivalent values used to identify records in the cutter/formation interaction database to determine the forces required on the cutter based on the calculated interaction during simulated drilling. Those skilled in the art will also appreciate that in other embodiments, other methods for determining equivalent values for comparing against data obtained from cutter/formation interact tests may be used as determined by a system designer.

Once the forces on the cutters are determined, the forces are transformed into the bit coordinate system (illustrated in FIG. 12) and all of the forces on cutters in the axial direction are summed to obtain the total axial force on the bit, $F_Z$ during that incremental drilling step 334. The total axial force is then compared to the weight on bit (WOB) 336. The weight on bit was provided as input at 310. The simplifying assumption used (at 336) is that the total axial force acting on the bit (i.e., sum of axial forces on each of the cutters, etc.) should be equal to the weight on bit (WOB) at the incremental drilling step 334. If the total axial force $F_Z$ is greater than the WOB, the initial incremental axial displacement $\Delta d_i$ applied to the bit is considered larger than the actual axial displacement that would result from the WOB. If this is the case, the bit is moved up a fractional incremental distance (or, expressed alternatively, the incremental axial movement of the bit is reduced), and the calculations in the axial force equilibrium loop 326 are repeated to determine the forces on the bit at the adjusted incremental axial displacement.

If the total axial force $F_Z$ on the bit, from the resulting incremental axial displacement is less than the WOB, the resulting incremental axial distance $\Delta d_{bit,i}$ applied to the bit is considered smaller than the actual incremental axial displacement that would result from the selected WOB. In this case, the bit is moved further downward a second fractional incremental distance, and the calculations in the axial force equilibrium loop 326 are repeated for the adjusted incremental axial displacement. The axial force equilibrium loop 326 is iteratively repeated until an incremental axial displacement for the bit is obtained which results in a total axial force on the bit substantially equal to the WOB, within a selected error range.

Once the correct incremental displacement, $\Delta d_i$, of the bit is determined for the incremental rotation, the forces on each of the cutters, determined using cutter/formation interaction data as discussed above, are transformed into the bit coordinate system, $O_{ZR\Theta}$, (illustrated in FIG. 12) to determine the lateral forces (radial and circumferential) on each of the cutting elements 340. As shown in FIG. 17C and previously discussed, the forces on each of the cutters is calculated based on the movement of the cutter, the calculated interference parameters (the depth of cut, the interference surface area, and the engaging edge for each of the cutters), bit/cutter design parameters (such as back rake angle, side rake angle, and bevel size, etc. for each of the cutters) and cutter/formation interaction data, wherein the forces required on the cutting elements are obtained from cutter/interaction data records having interaction parameter values similar to those calculated for on a cutter during drilling.

Wear of the cutters is also accounted for during drilling. In one implementation, cutter wear is determined for each cutter based on the interaction parameters calculated for the cutter and cutter/interaction data, wherein the cutter interaction data includes wear data, 342. In one or more other embodiments, wear on each of the cutters may be determined using a wear model corresponding to each type of cutter based on the type of formation being drilled by the cutter (see a later section). As shown in FIG. 17C, the cutter shape is then modified using cutter wear results to form worn cutters reflective of how the cutters would be worn during drilling, 344. By reflecting the wear of cutters during drilling, the performance of the bit may more accurately reflect the actual response of the bit during drilling.

During the simulation, the bottomhole geometry is also updated, 346, to reflect the removal of earth formation from the bottomhole surface during each incremental rotation of the drill bit. In one implementation, the bottomhole surface is represented by a coordinate mesh or grid having 1 mm grid blocks, wherein areas of interference between the bottomhole surface and cutters during drilling are removed from the bottomhole after each incremental drilling step.

The steps of the main simulation loop 320 described above are repeated by applying a subsequent incremental rotation to the bit 322 and repeating the calculations to obtain forces and wear on the cutters and an updated bottomhole geometry to reflect the incremental drilling. Successive incremental rotations are repeated to simulate the performance of the drill bit drilling through earth formations.

Using the total number of bit revolutions to be simulated (provided as input at 310) as the termination command, the incremental rotation and displacement of the bit and subsequent calculations are repeated until the selected total number of bit revolutions is reached. Repeating the simulation loop 320 as described above results in simulating the performance of a fixed cutter drill bit drilling earth formations with continuous updates of the bottomhole pattern drilled, thereby simulating the actual drilling of the bit in selected earth formations. In other implementations, the simulation may be terminated, as desired, by operator command or by performing any other specified operation. Alternatively, ending conditions such as the final drilling depth (axial span) for simulated drilling may be provided as input and used to automatically terminate the simulated drilling.

Figure 6A:
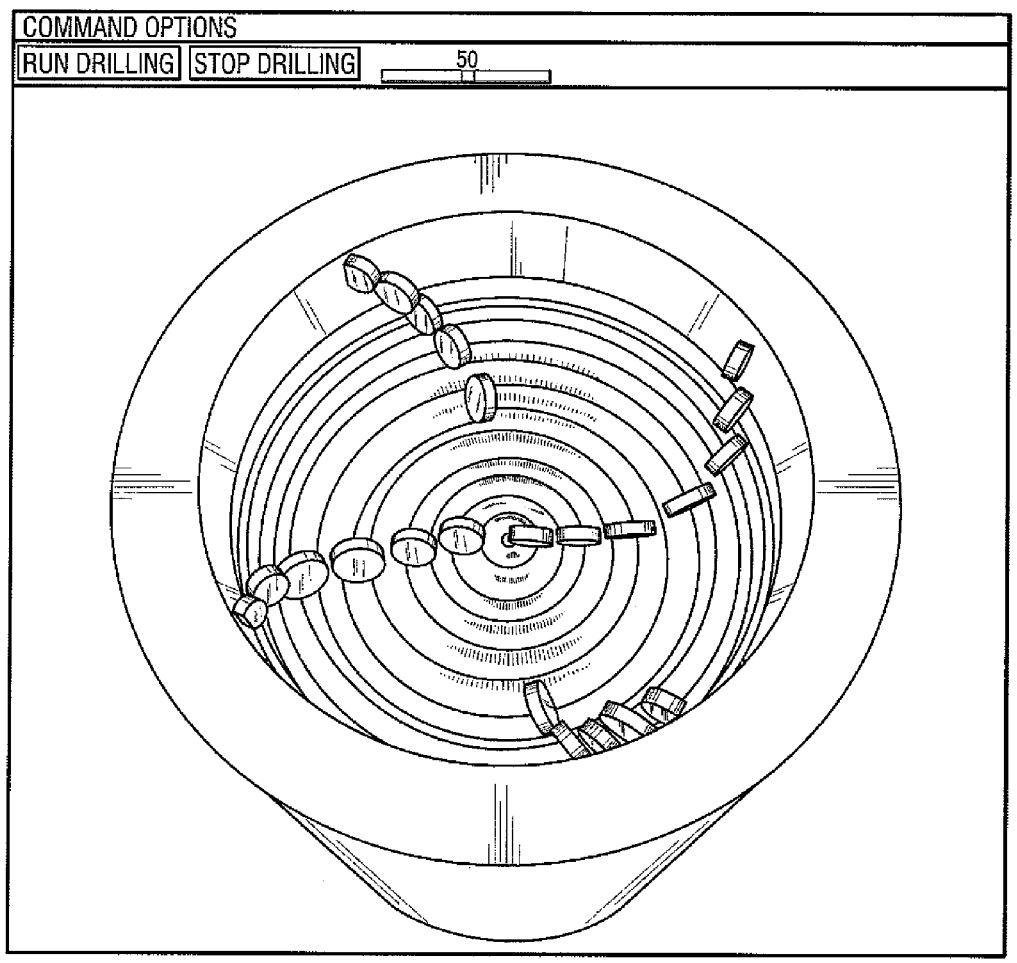

The above described method for modeling a bit can be executed by a computer wherein the computer is programmed to provide results of the simulation as output information after each main simulation loop, 348 in FIG. 17C. The output information may be any information that characterizes the performance of the selected drill bit drilling earth formation. Output information for the simulation may include forces acting on the individual cutters during drilling, scraping movement/distance of individual cutters in contact with the bottomhole (including the hole wall), total forces acting on the bit during drilling, and the rate of penetration for the selected bit. This output information may be presented in the form of a visual representation 350, such as a visual representation of the hole being drilled in an earth formation where cut sections calculated as being removed during drilling are visually "removed" from the bottomhole surface. One example of this type of visual representation is shown in FIG. 6A. FIG. 6A is a screen shot of a visual display of cutters 612 on a bit (bit body not shown) cutting through earth formation 610 during drilling. During a simulation, the visual display shows the rotation of the cutters 612 on the bottomhole of the formation 610 during the drilling, wherein the bottomhole surface is updated as formation is calculated as removed from the bottomhole during each incremental drilling step.

Figure 6B:
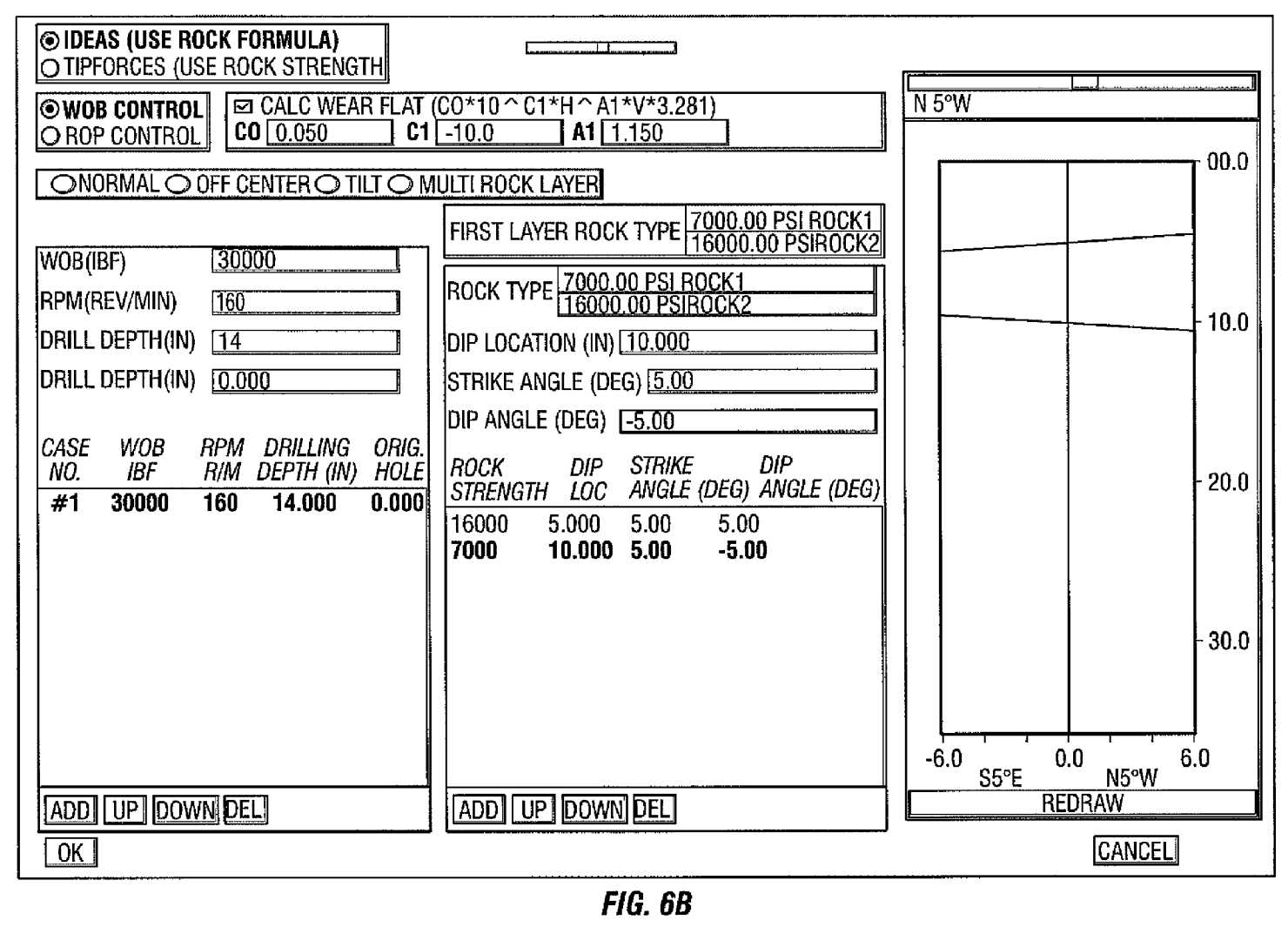
Figure 6C:
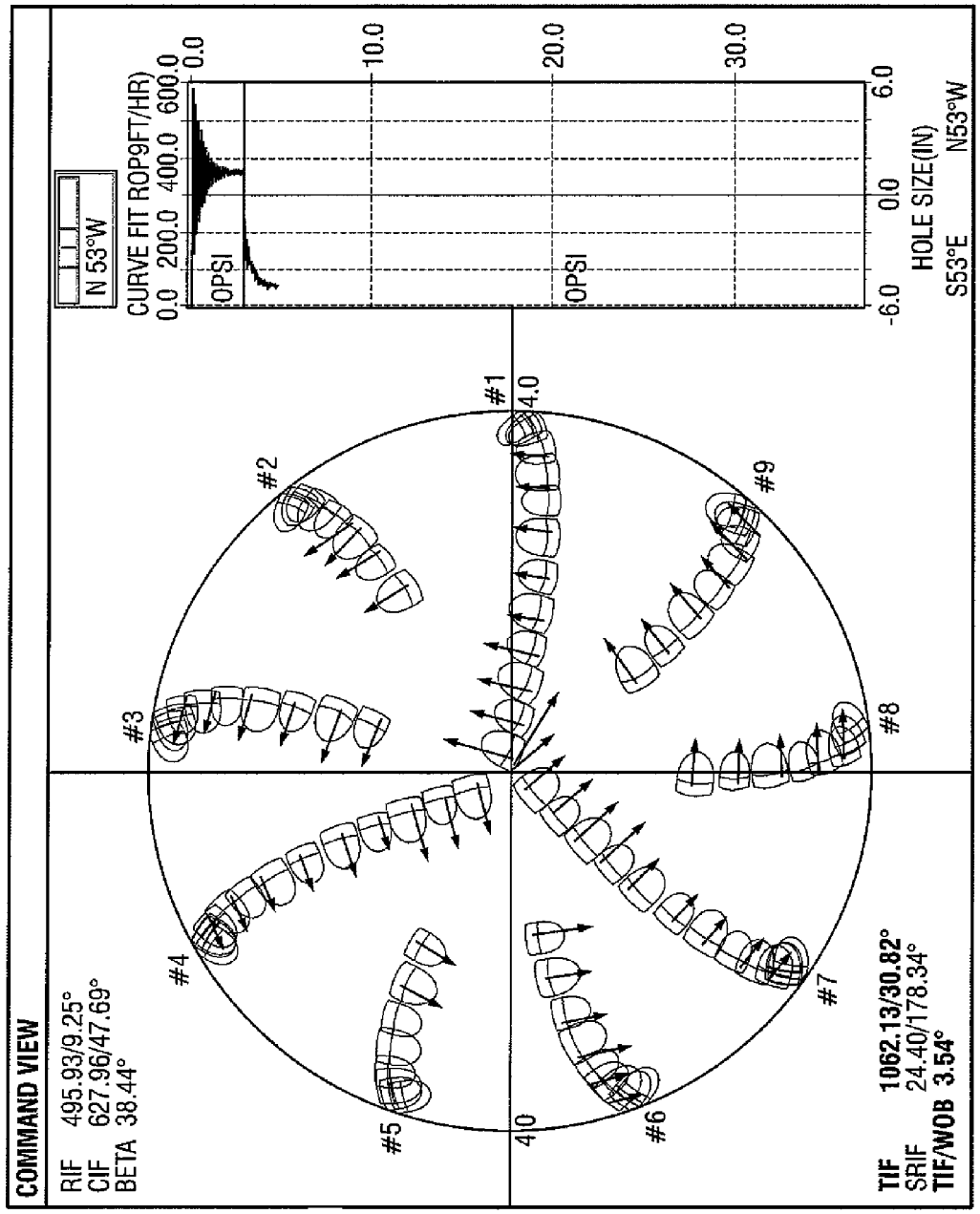

Within the program, the earth formation being drilled may be defined as comprising a plurality of layers of different types of formations with different orientations for the bedding planes, similar to that expected to be encountered during drilling. One example of the earth formation being drilled defined as layers of different types of formations is illustrated in FIGS. 6B and 6C. In these illustrations, the boundaries (bedding orientations) separating different types of formation layers (602, 603 605) are shown at 601, 604, 606. The locations of the boundaries for each type of formation are known, as are the dip and strike angles of the interface planes. During drilling the location of each of the cutters is also known. Therefore, a simulation program having an earth formation defined as shown will accesses data from the cutter/formation interaction database based on the type of cutter on the bit and the particular formation type being drilled by the cutter at that point during drilling. The type of formation being drilled will change during the simulation as the bit penetrates through the earth formations and cross the boundaries of adjacent layers during drilling. In addition to showing the different types of formation being drilled, the graph in FIG. 6C also shows the calculated ROP.

Figure 6D:
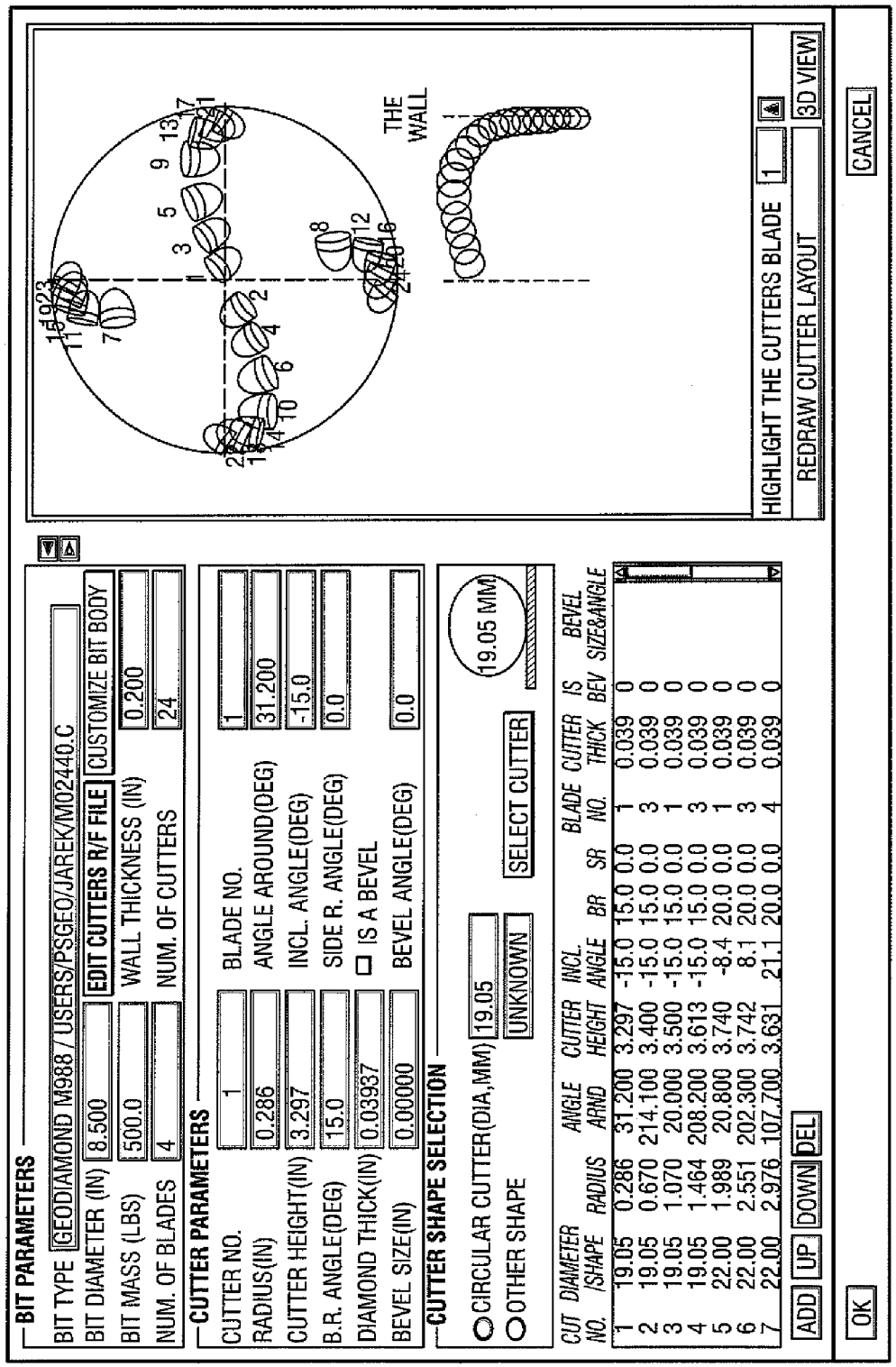

Visual representation generated by a program in accordance with one or more embodiments of the invention may include graphs and charts of any of the parameters provided as input, any of the parameters calculated during the simulation, or any parameters representative of the performance of the selected drill bit drilling through the selected earth formation. In addition to the graphical displays discussed above, other examples of graphical displays generated by one implementation of a simulation program in accordance with an embodiment of the invention are shown in FIGS. 6D-6G. FIG. 6D shows an visual display of the overlapping cutter profile 614 for the bit provided as input, a layout for cutting elements on blade one of the bit 616, and a user interface screen 618 that accepts as input bit geometry data from a user.

Figure 6E:
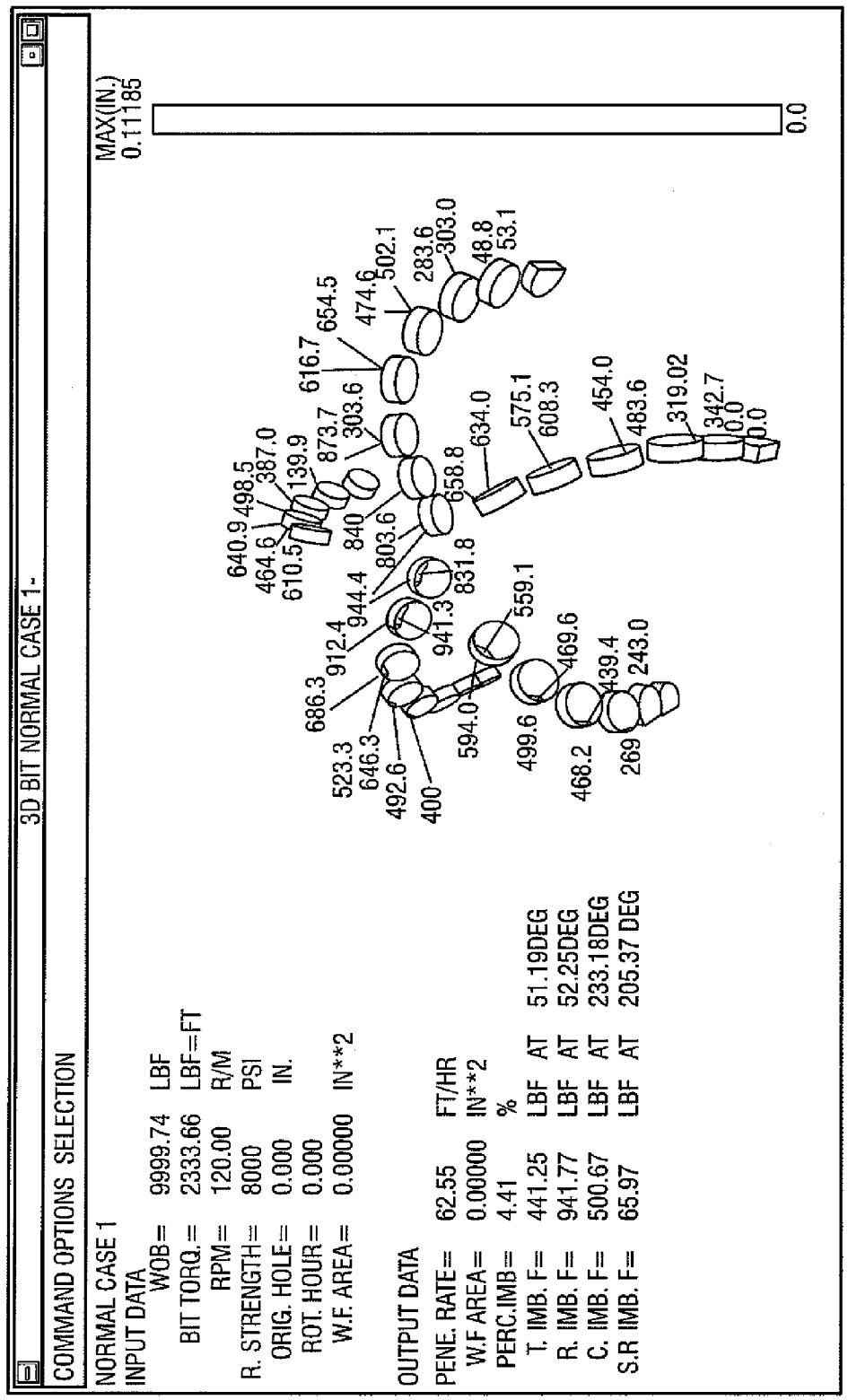

FIG. 6E shows a perspective view (with the bit body not shown for clarity) of the cutters on the bit 622 with the forces on the cutters of the bit indicated. In this implementation, the cutters was meshed, as is typically done in finite element analysis, and the forces on each element of the cutters was determined. The interference areas for each element may be illustrated by shades of gray (or colors), indicating the magnitude of the depth of cut on the element, and forces acting on each cutter may be represented by arrows and numerical values adjacent to the arrows. The visual display shown in FIG. 6E also includes a display of drilling parameter values at 620, including the weight on bit, bit torque, RPM, interred rock strength, hole origin depth, rotation hours, penetration rate, percentage of the imbalance force with respect to weight on bit, and the tangential (axial), radial and circumferential imbalance forces. The side rake imbalance force is the imbalance force caused by the side rake angle only, which is included in the tangential, radial, and circumferential imbalance force.

Figure 6F:
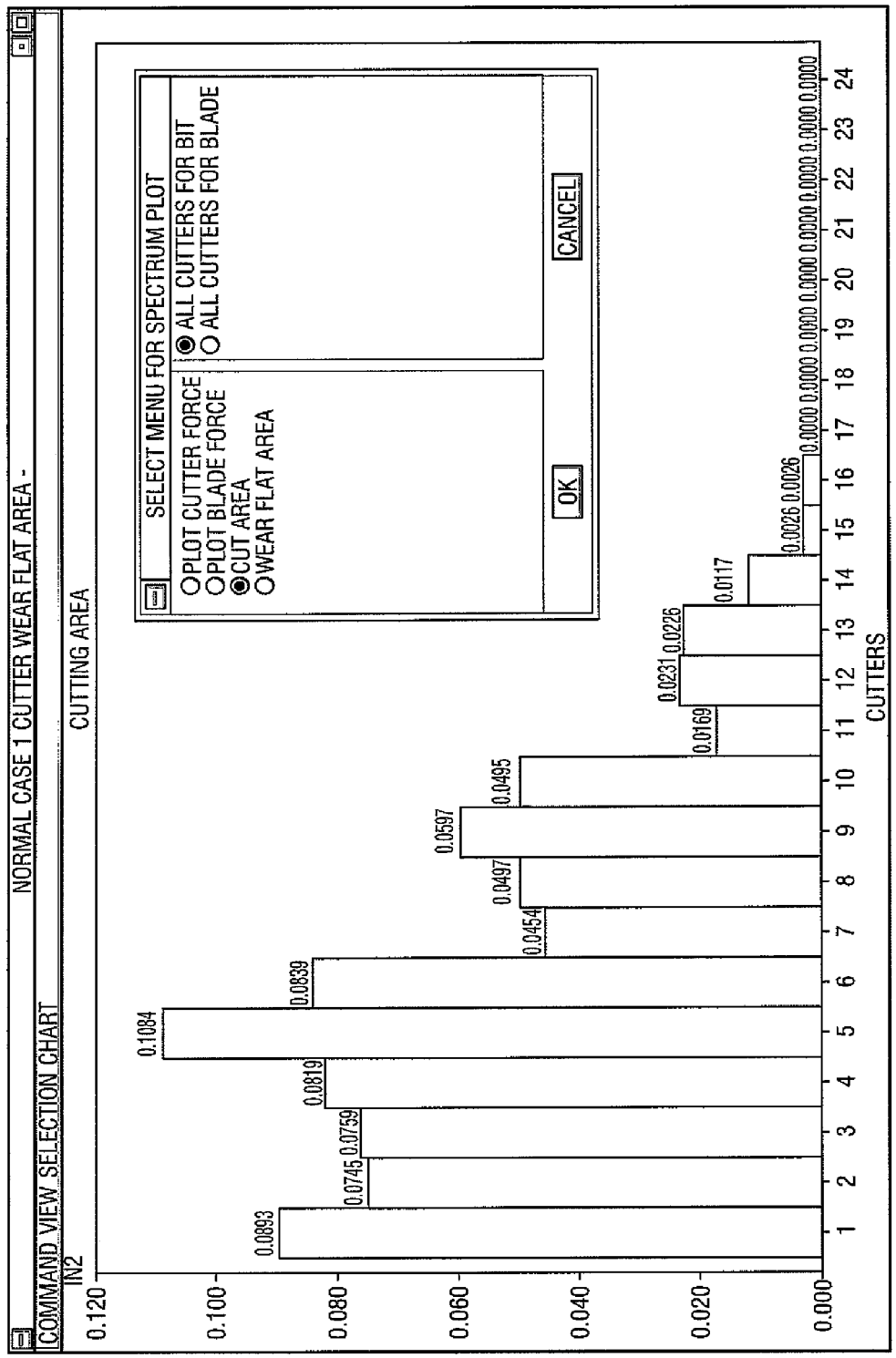
Figure 6G:
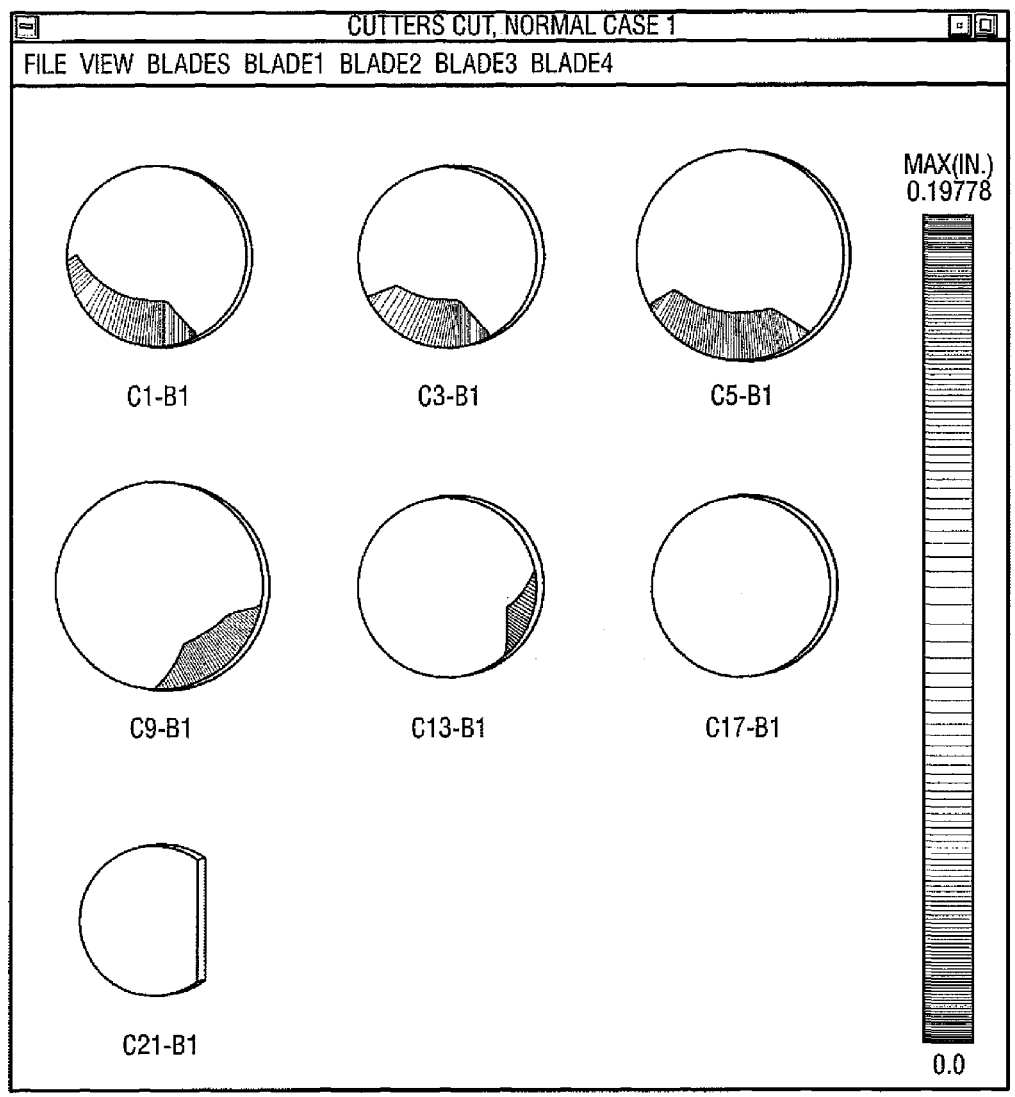

A visual display of the force on each of the cutters is shown in closer detail in FIG. 6G, wherein, similar to display shown FIG. 6E, the magnitude or intensity of the depth of cut on each of the element segments of each of the cutters may be illustrated by shades of gray (or color). In this display, the designations "C1-B1" provided under the first cutter shown indicates that this is the calculated depth of cut on the first cutter ("cutter 1") on blade 1. FIG. 6F shows a graphical display of the area cut by each cutter on a selected blade. In this implementation, the program is adapted to allow a user to toggle between graphical displays of cutter forces, blade forces, cut area, or wear flat area for cutters on any one of the blades of the bit. In addition to graphical displays of the forces on the individual cutters (illustrated in FIGS. 6E and 6G), visual displays can also be generated showing the forces calculated on each of the blades of the bit and the forces calculated on the drill bit during drilling. The type of displays illustrated herein is not a limitation of the invention. The means used for visually displaying aspects of simulated drilling is a matter of convenience for the system designer, and is not a limitation of the invention.

Examples of geometric models of a fixed cutter drill bit generated in one implementation of the invention are shown in FIG. 6A, and 6C-6E. In all of these examples, the geometric model of the fixed cutter drill bit is graphically illustrated as a plurality of cutters in a contoured arrangement corresponding to their geometric location on the fixed cutter drill bit. The actual body of the bit is not illustrated in these figures for clarity so that the interaction between the cutters and the formation during simulated drilling can be shown.

Examples of output data converted to visual representations for an embodiment of the invention are provided in FIGS. 6A-6G. These figures include area renditions representing 3-dimensional objects preferably generated using means such as OPEN GL a 3-dimensional graphics language originally developed by Silicon Graphics, Inc., and now a part of the public domain. For one embodiment of the invention, this graphics language was used to create executable files for 3-dimensional visualizations. FIGS. 6C-6D show examples of visual representations of the cutting structure of a selected fixed cutter bit generated from defined bit design parameters provided as input for a simulation and converted into visual representation parameters for visual display. As previously stated, the bit design parameters provided as input may be in the form of 3-dimensional CAD solid or surface models. Alternatively, the visual representation of the entire bit, bottomhole surface, or other aspects of the invention may be visually represented from input data or based on simulation calculations as determined by the system designer.

FIG. 6A shows one example of the characterization of formation removal resulting from the scraping and shearing action of a cutter into an earth formation. In this characterization, the actual cuts formed in the earth formation as a result of drilling is shown.

FIG. 6F-6G show examples of graphical displays of output for an embodiment of the invention. These graphical displays were generated to allow the analysis of effects of drilling on the cutters and on the bit.

FIGS. 6A-6G are only examples of visual representations that can be generated from output data obtained using an embodiment of the invention. Other visual representations, such as a display of the entire bit drilling an earth formation or other visual displays, may be generated as determined by the system designer. Graphical displays generated in one or more embodiments of the invention may include a summary of the number of cutters in contact with the earth formation at given points in time during drilling, a summary of the forces acting on each of the cutters at given instants in time during drilling, a mapping of the cumulative cutting achieved by the various sections of a cutter during drilling displayed on a meshed image of the cutter, a summary of the rate of penetration of the bit, a summary of the bottom of hole coverage achieved during drilling, a plot of the force history on the bit, a graphical summary of the force distribution on the bit, a summary of the forces acting on each blade on the bit, the distribution of force on the blades of the bit.

FIG. 6A shows a three dimensional visual display of simulated drilling calculated by one implementation of the invention. Clearly depicted in this visual display are expected cuts in the earth formation resulting from the calculated contact of the cutters with the earth formation during simulated drilling. This display can be updated in the simulation loop as calculations are carried out, and/or visual representation parameters, such as parameters for a bottomhole surface, used to generate this display may be stored for later display or for use as determined by the system designer. It should be understood that the form of display and timing of display is a matter of convenience to be determined by the system designer, and, thus, the invention is not limited to any particular form of visual display or timing for generating displays.

It should be understood that the invention is not limited to these types of visual representations, or the type of display. The means used for visually displaying aspects of simulated drilling is a matter of convenience for the system designer, and is not intended to limit the invention.

Modeling Wear of a Fixed Cutter Drill Bit

Being able to model a fixed cutter bit and the drilling process with accuracy makes it possible to study the wear of a cutter or the drill bit. The ability to model the fixed cutter wear accurately in turn makes it possible to improve the accuracy of the simulation of the drilling and/or the design of a drill bit.

As noted above, cutter wear is a function of the force exerted on the cutter. In addition, other factors that may influence the rates of cutter wear include the velocity of the cutter brushing against the formation (i.e., relative sliding velocity), the material of the cutter, the area of the interference or depth of cut (d), and the temperature. Various models have been proposed to simulate the wear of the cutter. For example, U.S. Pat. No. 6,619,411 issued to Singh et al. (the '411 patent) discloses methods for modeling the wear of a roller cone drill bit.

As disclosed in the '411 patent, abrasion of materials from a drill bit may be analogized to a machining operation. The volume of wear produced will be a function of the force exerted on a selected area of the drill bit and the relative velocity of sliding between the abrasive material and the drill bit. Thus, in a simplistic model, $WR=f(F_N, v)$, where WR is the wear rate, $F_N$ is the force normal to the area on the drill bit and v is the relative sliding velocity. $F_N$, which is a function of the bit-formation interaction, and v can both be determined from the above-described simulation.

While the simple wear model described above may be sufficient for wear simulation, embodiments of the invention may use any other suitable models. For example, some embodiments of the invention use a model that takes into account the temperature of the operation (i.e., $WR=f(F_N, v, T)$), while other embodiments may use a model that includes another measurement as a substitute for the force acting on the bit or cutter. For example, the force acting on a cutter may be represented as a function of the depth of cut (d). Therefore, $F_N$ may be replace by the depth of cut (d) in some model, as shown in equation (1):

$$WR = a1 \times 10^{a2} \times d^{a3} \times v^{a4} \times T^{a5} \qquad (1)$$

where WR is the wear rate, d is the depth of cut, v is the relative sliding velocity, T is a temperature, and a1-a5 are constants.

The wear model shown in equation (1) is flexible and can be used to model various bit-formation combinations. For each bit-formation combination, the constants (a1-a5) may be fine tuned to provide an accurate result. These constants may be empirically determined using defined formations and selected bits in a laboratory or from data obtained in the fields. Alternatively, these constants may be based on theoretical or semi-empirical data.

The term $a1 \times 10^{a2}$ is dependent on the bit/cutter (material, shape, arrangement of the cutter on the bit, etc.) and the formation properties, but is independent of the drilling parameters. Thus, the constants a1 and a2 once determined can be used with similar bit-formation combinations. One of ordinary skill in the art would appreciate that this term ($a1 \times 10^{a2}$) may also be represented as a simple constant k.

The wear properties of different materials may be determined using standard wear tests, such as the American Society for Testing and Materials (ASTM) standards G65 and B611, which are typically used to test abrasion resistance of various drill bit materials, including, for example, materials used to form the bit body and cutting elements. Further, superhard materials and hardfacing materials that may be applied to selected surfaces of the drill bit may also be tested using the ASTM guidelines. The results of the tests are used to form a database of rate of wear values that may be correlated with specific materials of both the drill bit and the formation drilled, stress levels, and other wear parameters.

The remaining term in equation (1), $d^{a3} \times v^{a4} \times T^{a5}$ is dependent on the drilling parameters (i.e., the depth of cut, the relative sliding velocity, and the temperature). With a selected bit-formation combination, each of the constants (a3, a4, and a5) may be determined by varying one drilling parameter and holding other drilling parameters constant. For example, by holding the relative sliding velocity (v) and temperature (T) constant, a3 can be determined from the wear rate changes as a function of the depth of cut (d). Once these constants are determined, they can be stored in a database for later simulation/modeling.

Figure 18:
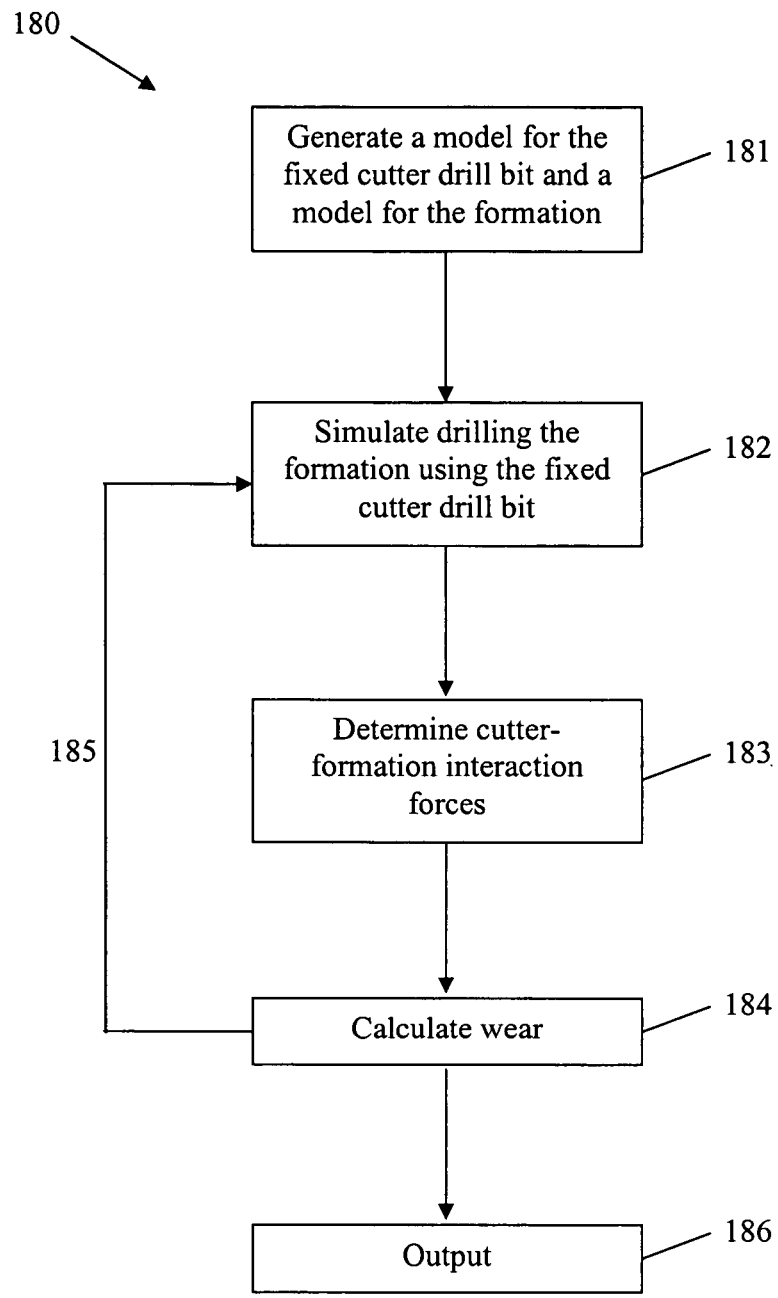
FIG. 18 shows a method for simulating wear of a cutter or a fixed cutter drill bit in accordance with one embodiment of the invention.

The modeling may be performed in various manners. For example, FIG. 18 shows a method 180 that can be used to perform wear modeling in accordance with one embodiment of the invention. First, a model for the fixed cutter drill bit and a model for the formation are generated (step 181). The model of the drill bit may be a mesh or surface model based on CAD. The formation model may be a mesh model with the formation strength that may be linear or non-linear. The formation may be homogeneous, inhomogeneous, or comprises multilayers, which may have different dips and strikes. The models are then used to perform drilling simulation (step 182). As described above, the simulation is performed by incrementally rotating the drill bit with a selected angle at a selected RPM. The simulation may be performed with a constant WOB or a constant ROP. In each step of the simulation, the cutter (or drill bit)-formation interactions are determined (step 183). The force that acts on the cutter or drill bit can be determined from these interactions. Finally, the wear of the cutter (or the drill bit) can then be calculated from the force acting on the cutter and other parameters (relative sliding velocity, temperature, etc.) (step 184). The wear calculation may be performed on a selected region on the cutting surface of the cutter each time. Then, the process is repeated (loop 185) for the selected number of regions that cover the entire contact-wear area on the cutting surface to produce the overall wear on the cutter. These processes can then be repeated for each cutter on the drill bit. The calculated wear can be outputted during the simulation or after the simulation is complete (step 186). The output may be graphical displays on the cutting surface of the cutter, showing different extents of wear in different colors, different shades of gray, or histogram. Alternatively, the output may be numbers, which may be in a text file or table and can be used by other programs to analyze the wear results.

Figure 19:
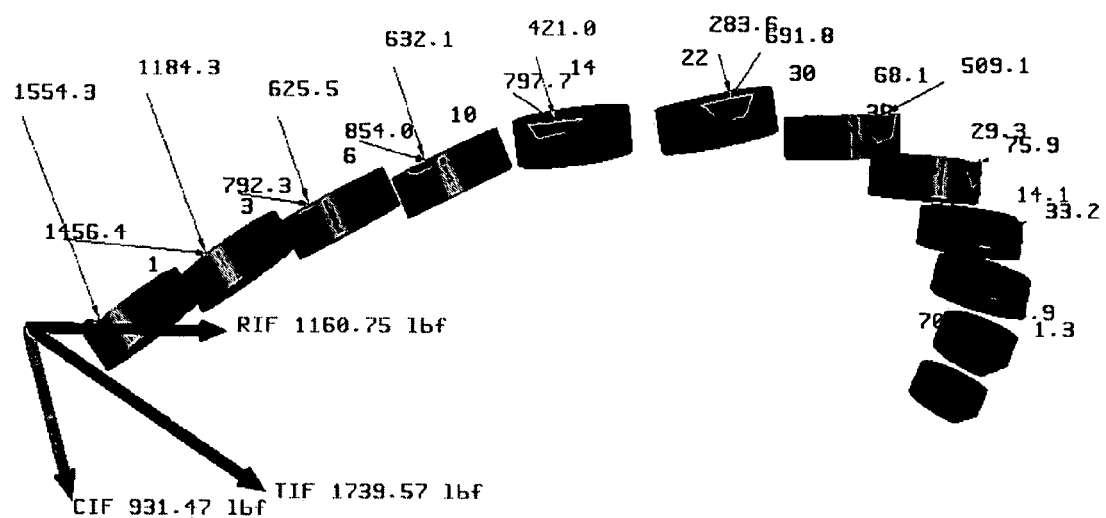
FIG. 19 shows a graphical display of a group of worn cutters illustrating different extents of wear on the cutters in accordance with one embodiment of the invention.

FIG. 19 shows one example of a graphical display that shows a group of cutters on a blade. Each of the cutters have different extents of wear, depending on their locations on the bit. As shown, the wears on the cutters are illustrates as wear flats on worn bits. The extents of the wear (i.e., the areas of the wear flats) may be represented in different colors or in different shades of gray. Alternatively, the values of the wear areas may be output and displayed.

As shown in FIG. 19, the cutters in the middle region on the blade suffer more wear in this example. This graphic display gives a drill bit design engineer a clear indication of how to improve the useful life of the drill bit. For example, hardfacing materials may be applied to those cutter experiencing more wear so that they will not unnecessarily shorten the service life of the entire bit. Similarly, cutters on other blades may be displayed and analyzed in a similar fashion. Therefore, the graphical display provides a very convenient and efficient way to permit a design engineer to quickly optimize the performance of a bit. This aspect of the invention will be described in more detail in the following section on bit design.

Note that the simulation of the wear (steps 182-185) may be performed dynamically with the drill bit attached to a drill string. The drill string may further include other components commonly found in a bottom-hole assembly (BHA). For example, various sensors may be included in drill collars in the BHA. In addition, the drill string may include stabilizers that reduce the wobbling of the BHA or drill bit.

The dynamic modeling also takes into account the drill string dynamics. In a drilling operation, the drill string may swirl, vibrate, and/or hit the wall of the borehole. The drill string may be simulated as multiple sections of pipes. Each section may be treated as a "node," having different physical properties (e.g., mass, diameter, flexibility, stretchability, etc.). Each section may have a different length. For example, the sections proximate to the BHA may have shorter lengths such that more "nodes" are simulated close to BHA, while sections close to the surface may be simulated as longer nodes to minimize the computational demand.

In addition, the "dynamic modeling" may also take into account the hydraulic pressure from the mud column having a specific weight. Such hydraulic pressure acts as a "confining pressure" on the formation being drilled. In addition, the hydraulic pressure (i.e., the mud column) provides buoyancy to the BHA and the drill bit.

The dynamic simulation may also generate worn cutters after each iteration and use the worn cutters in the next iteration. By using the worn cutters in the simulation, the results will be more accurate. By taking into account all these interactions, the dynamic simulation of the present invention can provide a more realistic picture of the performance of the drill bit.

As noted above, embodiments of the invention can model drilling in a formation comprising multiple layers, which may include different dip and/or strike angles at the interface planes, or in an inhomogeneous formation (e.g., anisotropic formation or formations with pockets of different compositions). Thus, embodiments of the invention are not limited to modeling bit or cutter wears in a homogeneous formation.

Being able to model the wear of the cutting elements (cutters) and/or the bit accurately makes it possible to design a fixed cutter bit to achieve the desired wear characteristics. In addition, the wear modeling may be used during a drilling modeling to update the drill bit as it wears. This can significantly improve the accuracy of the drilling simulation.

Designing Fixed Cutter Bits

Figure 15:
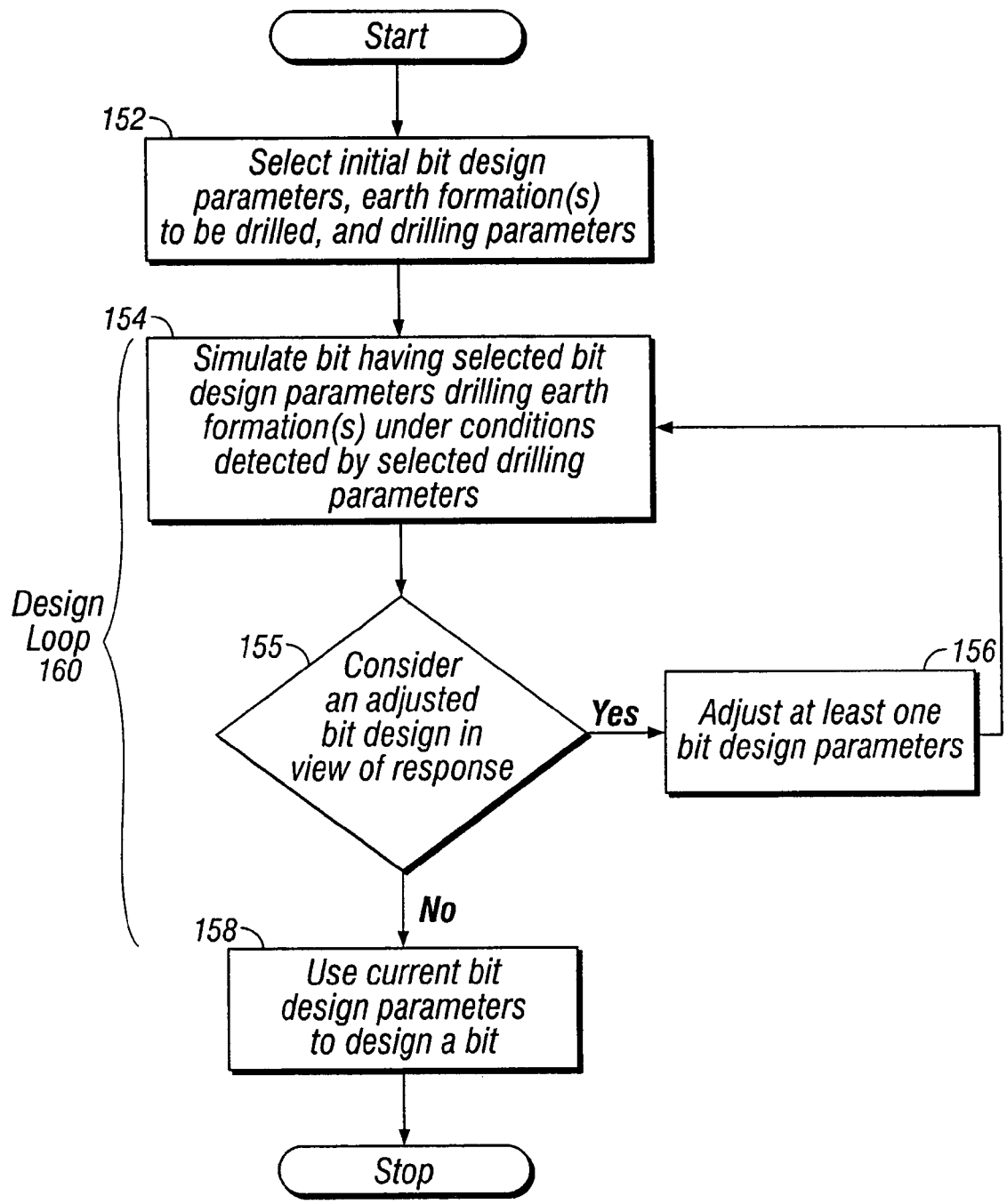
FIG. 15 shows a flowchart of an embodiment of the invention for designing fixed cutter bits.

In another aspect of one or more embodiments, the invention provides a method for designing a fixed cutter bit. A flow chart for a method in accordance with this aspect is shown in FIG. 15. The method includes selecting bit design parameters, drilling parameters, and an earth formation to be represented as drilled, at step 152. Then a bit having the selected bit design parameters is simulated as drilling in the selected earth formation under the conditions dictated by the selected drilling parameters, at step 154. The simulating includes calculating the interaction between the cutters on the drill bit and the earth formation at selected increments during drilling. This includes calculating parameters for the cuts made in the formation by each of the cutters on the bit and determining the forces and the wear on each of the cutters during drilling. Then depending upon the calculated performance of the bit during the drilling of the earth formation, at least one of the bit design parameters is adjusted, at step 156. The simulating, 154, is then repeated for the adjusted bit design. The adjusting at least one design parameter 156 and the repeating of the simulating 154 are repeated until a desired set of bit design parameters is obtained. Once a desired set of bit parameters is obtained, the desired set of bit parameters can be used for an actual drill bit design, 158.

A set of bit design parameters may be determined to be a desired set when the drilling performance determined for the bit is selected as acceptable. In one implementation, the drilling performance may be determined to be acceptable when the calculated imbalance force on a bit during drilling is less than or equal to a selected amount.

Embodiments of the invention similar to the method shown in FIG. 15 can be adapted and used to analyze relationships between bit design parameters and the drilling performance of a bit. Embodiments of the invention similar to the method shown in FIG. 15 can also be adapted and used to design fixed cutter drill bits having enhanced drilling characteristics, such as faster rates of penetration, more even wear on cutting elements, or a more balanced distribution of force on the cutters or the blades of the bit. Methods in accordance with this aspect of the invention can also be used to determine optimum locations or orientations for cutters on the bit, such as to balance forces on the bit or to optimize the drilling performance (rate of penetration, useful life, etc.) of the bit.

In alternative embodiments, the method for designing a fixed cutter drill bit may include repeating the adjusting of at last one drilling parameter and the repeating of the simulating the bit drilling a specified number of times or, until terminated by instruction from the user. In these cases, repeating the "design loop" 160 (i.e., the adjusting the bit design and the simulating the bit drilling) described above can result in a library of stored output information which can be used to analyze the drilling performance of multiple bits designs in drilling earth formations and a desired bit design can be selected from the designs simulated.

In one or more embodiments in accordance with the method shown in FIG. 15, bit design parameters that may be altered at step 156 in the design loop 160 may include the number of cutters on the bit, cutter spacing, cutter location, cutter orientation, cutter height, cutter shape, cutter profile, cutter diameter, cutter bevel size, blade profile, bit diameter, etc. These are only examples of parameters that may be adjusted. Additionally, bit design parameter adjustments may be entered manually by an operator after the completion of each simulation or, alternatively, may be programmed by the system designer to automatically occur within the design loop 160. For example, one or more selected parameters maybe incrementally increased or decreased with a selected range of values for each iteration of the design loop 160. The method used for adjusting bit design parameters is a matter of convenience for the system designer. Therefore, other methods for adjusting parameters may be employed as determined by the system designer. Thus, the invention is not limited to a particular method for adjusting design parameters.

An optimal set of bit design parameters may be defined as a set of bit design parameters which produces a desired degree of improvement in drilling performance, in terms of rate of penetration, cutter wear, optimal axial force distribution between blades, between individual cutters, and/or optimal lateral forces distribution on the bit. For example, in one case, a design for a bit may be considered optimized when the resulting lateral force on the bit is substantially zero or less than 1% of the weight on bit.

To optimize the bit design with respect to wear of the cutter and/or bit, the wear modeling described above may be used to select and design cutting elements. Cutting element material, geometry, and placement may be iteratively varied to provide a design that wears acceptably and that compensates, for example, for cutting element wear or breakage. For example, iterative testing may be performed using different cutting element materials at different locations (e.g., on different surfaces) on selected cutting elements. Some cutting elements surfaces may be, for example, tungsten carbide, while other surfaces may include, for example, overlays of other materials such as polycrystalline diamond. For example, a protective coating may be applied to a cutting surface to, for example, reduce wear. The protective coating may comprise, for example, a polycrystalline diamond overlay over a base cutting element material that comprises tungsten carbide.

Material selection may also be based on an analysis of a force distribution (or wear) over a selected cutting element, where areas that experience the highest forces or perform the most work (e.g., areas that experience the greatest wear) are coated with hardfacing materials or are formed of wear-resistant materials.

Additionally, an analysis of the force distribution over the surface of cutting elements may be used to design a bit that minimizes cutting element wear or breakage. For example, cutting elements that experience high forces and that have relatively short scraping distances when in contact with the formation may be more likely to break. Therefore, the simulation procedure may be used to perform an analysis of cutting element loading to identify selected cutting elements that are subject to, for example, the highest axial forces. The analysis may then be used in an examination of the cutting elements to determine which of the cutting elements have the greatest likelihood of breakage. Once these cutting elements have been identified, further measures may be implemented to design the drill bit so that, for example, forces on the at-risk cutting elements are reduced and redistributed among a larger number of cutting elements.

Further, heat checking on gage cutting elements, heel row inserts, and other cutting elements may increase the likelihood of breakage. For example, cutting elements and inserts on the gage row and heel row typically contact walls of a wellbore more frequently than other cutting elements. These cutting elements generally have longer scraping distances along the walls of the wellbore that produce increased sliding friction and, as a result, increased frictional heat. As the frictional heat (and, as a result, the temperature of the cutting elements) increases because of the increased frictional work performed, the cutting elements may become brittle and more likely to break. For example, assuming that the cutting elements comprise tungsten carbide particles suspended in a cobalt matrix, the increased frictional heat tends to leach (e.g., remove or dissipate) the cobalt matrix. As a result, the remaining tungsten carbide particles have substantially less interstitial support and are more likely to flake off of the cutting element in small pieces or to break along interstitial boundaries.

The simulation procedure may be used to calculate forces acting on each cutting element and to further calculate force distribution over the surface of an individual cutting element. Iterative design may be used to, for example, reposition selected cutting elements, reshape selected cutting elements, or modify the material composition of selected cutting elements (e.g., cutting elements at different locations on the drill bit) to minimize wear and breakage. These modifications may include, for example, changing cutting element spacing, adding or removing cutting elements, changing cutting element surface geometries, and changing base materials or adding hardfacing materials to cutting elements, among other modifications.

Further, several materials with similar rates of wear but different strengths (where strength, in this case, may be defined by factors such as fracture toughness, compressive strength, hardness, etc.) may be used on different cutting elements on a selected drill bit based upon both wear and breakage analyses. Cutting element positioning and material selection may also be modified to compensate for and help prevent heat checking.

Referring again to FIG. 15, drilling characteristics used to determine whether drilling performance is improved by adjusting bit design parameters can be provided as output and analyzed upon completion of each simulation 154 or design loop 160. The output may include graphical displays that visually show the changes of the drilling performance or drilling characteristics. Drilling characteristics considered may include, the rate of penetration (ROP) achieved during drilling, the distribution of axial forces on cutters, etc. The information provided as output for one or more embodiments may be in the form of a visual display on a computer screen of data characterizing the drilling performance of each bit, data summarizing the relationship between bit designs and parameter values, data comparing drilling performances of the bits, or other information as determined by the system designer. The form in which the output is provided is a matter of convenience for a system designer or operator, and is not a limitation of the present invention.

Figure 16:
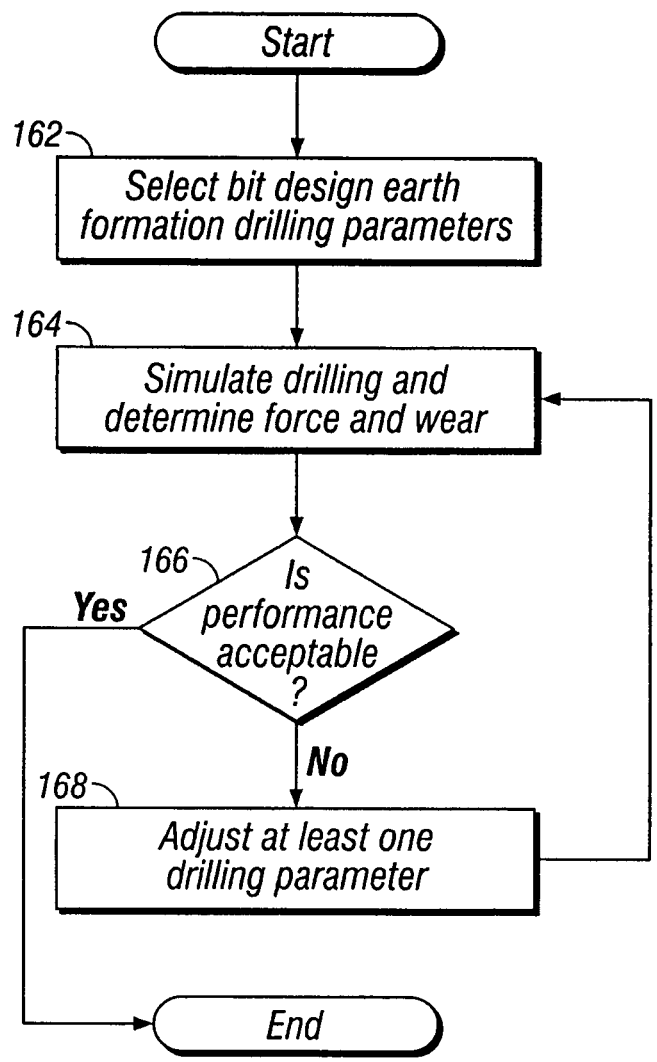
FIG. 16 shows a flowchart of an embodiment of the invention for optimizing drilling parameters for a fixed cutter bit drilling earth formations.

In one or more other embodiments, instead of adjusting bit design parameters, the method may be modified to adjust selected drilling parameters and consider their effect on the drilling performance of a selected bit design, as illustrated in FIG. 16. Similarly, the type of earth formation being drilled may be changed and the simulating repeated for different types of earth formations to evaluate the performance of the selected bit design in different earth formations.

In one embodiment, a plurality of wear rates may be calculated for the fixed cutter bit, because sections of the bit may be interacting with different formations and/or wearing at different rates due to a variety of factors. Those having ordinary skill in the art will recognize that multiple wear rates can be used simultaneously in embodiments of the present invention. For example, two or more wear rates to the calculations when doing multi-rock analysis. In this way, analysis may be done on two or more different formations that induce different wear rates on the bit.

As set forth above, one or more embodiments of the invention can be used as a design tool to optimize the performance of fixed cutter bits drilling earth formations. One or more embodiments of the invention may also enable the analysis of drilling characteristics for proposed bit designs prior to the manufacturing of bits, thus, minimizing or eliminating the expensive of trial and error designs of bit configurations. Further, the invention permits studying the effect of bit design parameter changes on the drilling characteristics of a bit and can be used to identify bit design which exhibit desired drilling characteristics. Further, use of one or more embodiments of the invention may lead to more efficient designing of fixed cutter drill bits having enhanced performance characteristics.

Optimizing Drilling Parameters

In another aspect of one or more embodiments of the invention, a method for optimizing drilling parameters of a fixed cutter bit is provided. Referring to FIG. 16, in one embodiment the method includes selecting a bit design, selecting initial drilling parameters, and selecting earth formation(s) to be represented as drilled 162. The method also includes simulating the bit having the selected bit design drilling the selected earth formation(s) under drilling conditions dictated by the selected drilling parameters 164. The simulating 164 may comprise calculating interaction between cutting elements on the selected bit and the earth formation at selected increments during drilling and determining the forces on the cutting elements based on cutter/interaction data in accordance with the description above. The method further includes adjusting at least one drilling parameter 168 and repeating the simulating 164 (including drilling calculations) until an optimal set of drilling parameters is obtained. An optimal set of drilling parameters can be any set of drilling parameters that result in an improved drilling performance over previously proposed drilling parameters. In preferred embodiments, drilling parameters are determined to be optimal when the drilling performance of the bit (e.g., calculated rate of penetration, etc.) is determined to be maximized for a given set of drilling constraints (e.g., within acceptable WOB or ROP limitations for the system).

Methods in accordance with the above aspect can be used to analyze relationships between drilling parameters and drilling performance for a given bit design. This method can also be used to optimize the drilling performance of a selected fixed cutter bit design.

Methods for modeling fixed cutter bits based on cutter/formation interaction data derived from laboratory tests conducted using the same or similar cutters on the same or similar formations may advantageously enable the more accurate prediction of the drilling characteristics for proposed bit designs. These methods may also enable optimization of fixed cutter bit designs and drilling parameters, and the production of new bit designs which exhibit more desirable drilling characteristics and longevity.

In one or more embodiments in accordance with the invention may comprise a program developed to allow a user to simulate the response of a fixed cutter bit drilling earth formations and switch back and forth between modeling drilling based on ROP control or WOB control. One or more embodiments in accordance with the invention include a computer program that uses a unique models developed for selected cutter/formation pairs to generate data used to model the interaction between different cutter/formation pairs during drilling.

The invention has been described with respect to preferred embodiments. It will be apparent to those skilled in the art that the foregoing description is only an example of embodiments of the invention, and that other embodiments of the invention can be devised which do not depart from the spirit of the invention as disclosed herein. Accordingly, the invention is to be limited in scope only by the attached claims.

What is claimed is:

1. A method for determining wear of a fixed curer drill bit, comprising:
    (a) simulating the fixed cutter drill bit drilling an earth formation;
    (b) determining a cutter-formation interaction force and a relative sliding velocity of a selected area on a cutting surface on a cutter of the fixed cutter drill bit during the drilling, wherein the selected area comprises an interface between the curing surface on the cutter and the earth formation;
    (c) calculating a wear rate of the selected area based on the cutter-formation interaction force and the relative sliding velocity;
    (d) converting the wear rate into a visual representation;
    (e) applying the calculated wear rate to at least one cutter of the simulated fixed curer drill bit;
    (f) continuing to simulate the fixed cutter drill bit with the at least one worn cutter drilling the earth formation;
    (g) ending the simulation and displaying output data;
    wherein the cutter-formation interaction force is determined as a function of a depth of cut; and
    wherein the calculating the wear rate is according to:

$$WR = a1 \times 10^{a2} \times d^{a3} \times v^{a4} \times T^{a5}$$

where WR is the wear rate, d is the depth of cut, v is the relative sliding velocity, T is a temperature, and a1-a5 are constants.

2. The method of claim 1, wherein the a1-a5 constants are determined based on laboratory test or field test data.

3. A method for designing a fixed cutter drill bit having a plurality of cutters, comprising:
    (a) selecting initial bit design parameters;
    (b) simulating drilling an earth formation using the fixed cutter drill bit;
    (c) determining wears on the plurality of cutters, wherein the determining the wears comprises determining a cutter-formation interaction force and a relative sliding velocity for each contact area on each of the plurality of cutters during the drilling, and calculating a wear rate of the each contact area based on the cutter-formation interaction force and the relative sliding velocity;
    (d) displaying a graphical display of the wears on the plurality of cutters;
    (e) applying the calculated wear rate to at least one cutter of the fixed cutter drill bit;

(f) continuing to simulate the fixed cutter drill bit with the at least one worn cutter drilling the earth formation;

(g) adjusting at least one bit design parameter based on the graphical display;

(h) repeating the simulating, the determining, the displaying, the applying, the continuing to simulate, and the adjusting until an optimal bit design parameters is reached;

wherein the cutter-formation interaction force is determined as a function of a depth of cut; and wherein the calculating the wear rate is according to:

$$WR = a1 \times 10^{a2} \times d^{a3} \times v^{a4} \times T^{a5}$$

where WR is the wear rate, d is the depth of cut, v is the relative sliding velocity, T is a temperature, and a1-a5 are constants.

4. The method of claim 3, wherein the a1-a5 constants are determined based on laboratory test or field test data.

* * * * *